US009461058B2

(12) United States Patent
Song et al.

(10) Patent No.: US 9,461,058 B2
(45) Date of Patent: Oct. 4, 2016

(54) METHODS OF FABRICATING SEMICONDUCTOR DEVICES INCLUDING MULTIPLE PATTERNING

(71) Applicant: Samsung Electronics Co., Ltd., Suwon-si, Gyeonggi-do (KR)

(72) Inventors: Min-Sung Song, Hwaseong-si (KR); Jae-Hwang Sim, Hwaseong-si (KR); Joon-Sung Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/016,737

(22) Filed: Feb. 5, 2016

(65) Prior Publication Data
US 2016/0233223 A1    Aug. 11, 2016

(30) Foreign Application Priority Data
Feb. 9, 2015 (KR) .......................... 10-2015-0019497

(51) Int. Cl.
*H01L 21/336* (2006.01)
*H01L 27/115* (2006.01)
*H01L 29/66* (2006.01)
*H01L 21/311* (2006.01)
*H01L 21/308* (2006.01)
*H01L 21/02* (2006.01)
*H01L 29/06* (2006.01)
*H01L 29/788* (2006.01)

(52) U.S. Cl.
CPC ..... *H01L 27/11519* (2013.01); *H01L 21/0214* (2013.01); *H01L 21/3081* (2013.01); *H01L 21/31144* (2013.01); *H01L 27/11521* (2013.01); *H01L 29/0696* (2013.01); *H01L 29/6653* (2013.01); *H01L 29/6656* (2013.01); *H01L 29/7883* (2013.01)

(58) Field of Classification Search
CPC .............. H01L 21/31144; H01L 27/11519; H01L 29/6653; H01L 29/6656
USPC ............................................ 438/264
See application file for complete search history.

(56) References Cited

U.S. PATENT DOCUMENTS

| | | | |
|---|---|---|---|
| 7,679,133 B2 | 3/2010 | Son et al. | |
| 8,183,152 B2 | 5/2012 | Sim et al. | |
| 8,216,948 B2 | 7/2012 | Moon | |
| 8,389,413 B2 | 3/2013 | Ohuchi | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,822,321 B2 | 9/2014 | Kajiwara | |
| 8,835,314 B2 | 9/2014 | Kim | |
| 2011/0233648 A1 | 9/2011 | Seol et al. | |
| 2016/0056081 A1* | 2/2016 | Baek ............... | H01L 21/823431 438/283 |
| 2016/0104619 A1* | 4/2016 | Chang ................ | H01L 21/0337 438/637 |

* cited by examiner

*Primary Examiner* — David S Blum
(74) *Attorney, Agent, or Firm* — Myers Bigel & Sibley, P.A.

(57) ABSTRACT

Methods of fabricating semiconductor devices may include forming a stopper layer, a lower hard mask layer, an intermediate hard mask layer, and an upper hard mask pattern on a substrate, forming first spacer patterns on sidewalls of the upper hard mask pattern, selectively etching the intermediate hard mask layer using the first spacer patterns as an etching mask, forming second spacer patterns on sidewalls of the etched intermediate hard mask layer, selectively etching the lower hard mask layer using the etched second spacer layer as an etching mask, forming a patterning mask pattern that exposes a cell area and covers a common source line area on the etched lower hard mask layer and the stopper layer, and selectively etching the stopper layer using the etched lower hard mask layer and the patterning mask pattern as etching masks to form stopper patterns.

20 Claims, 41 Drawing Sheets

METHODS OF FABRICATING SEMICONDUCTOR DEVICES INCLUDING MULTIPLE PATTERNING

CROSS-REFERENCE TO RELATED APPLICATION

This application claims priority under 35 U.S.C. §119 to Korean Patent Application No. 10-2015-0019497 filed on Feb. 9, 2015 in the Korean Intellectual Property Office, the disclosure of which is hereby incorporated herein by reference in its entirety.

BACKGROUND

1. Technical Field

Embodiments of the inventive concepts relate to methods of fabricating semiconductor devices, the methods including patterning.

2. Description of Related Art

Although the size of a circuit pattern configuring a semiconductor device has reduced rapidly, formation of fine patterns may be limited by an optical resolution limitation of an exposure device that transfers patterns on a semiconductor substrate. Therefore, much effort has been focused to develop methods of overcoming the limitations of an optical exposing resolution to form finer patterns.

In addition, it may become more difficult to contact a common source line (CSL) as the line width of a semiconductor device is reduced, due to a narrow cell area.

SUMMARY

Some embodiments of the inventive concepts provide methods of fabricating a semiconductor devices using a quadruple patterning technology.

Some embodiments of the inventive concepts provide methods of fabricating a semiconductor device in which an active area is commonly formed in a cell area using a multi-pattern.

According to some embodiments of the inventive concepts, methods of fabricating semiconductor devices are provided. A method may include forming a stopper layer, a lower hard mask layer, an intermediate hard mask layer, and an upper hard mask pattern on a substrate. The method may include forming first spacer patterns on sidewalls of the upper hard mask pattern. The method may include removing the upper hard mask pattern. The method may include selectively etching the intermediate hard mask layer using the first spacer patterns as an etching mask to form intermediate hard mask patterns. The method may include removing the first spacer patterns. The method may include forming second spacer patterns on sidewalls of the intermediate hard mask patterns. The method may include removing the intermediate hard mask patterns. The method may include selectively etching the lower hard mask layer using the second spacer patterns as an etching mask to form lower hard mask patterns. The method may include removing the second spacer patterns. The method may include forming a patterning mask pattern that exposes a cell area and covers a common source line area on the lower hard mask patterns and the stopper layer. The method may include selectively etching the stopper layer using the lower hard mask patterns and the patterning mask pattern as etching masks to form stopper patterns. The method may include removing the patterning mask pattern.

In some embodiments, the upper hard mask pattern may include a first upper hard mask pattern and a second upper hard mask pattern disposed on the first upper hard mask pattern.

In some embodiments, the first upper hard mask pattern may include a spin on hard mask (SOH). The second upper hard mask pattern may include silicon oxynitride.

In some embodiments, the intermediate hard mask layer may include the first intermediate hard mask layer and the second intermediate hard mask layer disposed on the first intermediate hard mask layer.

In some embodiments, the first intermediate hard mask layer may include a spin on hard mask (SOH). The second intermediate hard mask layer may include silicon oxynitride.

In some embodiments, the method may further include forming a tunnel dielectric layer and a data storage layer between the substrate and the stopper layer. The method may include etching the tunnel dielectric layer and the data storage layer using the stopper patterns as an etching mask to form tunnel dielectric layer patterns and data storage layer patterns. The method may include etching the substrate using the stopper patterns as an etching mask to form cell trenches.

In some embodiments, ones of the cell trenches may include an elongated rectangular shape in a plan view.

In some embodiments, ones of the cell trenches may include a "U" shape in a plan view.

In some embodiments, forming the cell trenches may include forming dummy areas in a shape that surrounds the cell trenches.

In some embodiments, the method may further include forming a core insulating layer on the substrate on which the cell trenches are formed. The method may include recessing the core insulating layer to form a cell filling insulator in the cell trenches. The method may include forming a dielectric layer on the cell filling insulator. The method may include forming a control gate electrode layer and a capping insulating layer on the dielectric layer.

In some embodiments, the patterning mask pattern may include a photoresist.

In some embodiments, the patterning mask pattern may include opening patterns that expose portions of the lower hard mask pattern and the stopper layer.

In some embodiments, forming the stopper patterns may include etching the stopper layer using the lower hard mask patterns that are exposed by the opening patterns as an etching mask to form the stopper patterns. The lower hard mask patterns that are exposed by the opening patterns may not completely be removed by etching the stopping layer.

In some embodiments, opening patterns may expose a "U" shape of the lower hard mask patterns in a plan view.

According to some embodiments, methods of fabricating semiconductor devices may be provided. A method may include forming a stopper layer, a lower hard mask layer, an intermediate hard mask layer, and an upper hard mask layer on a substrate. The method may include forming a first patterning mask pattern that has an elongated rectangular shape on the upper hard mask layer. The method may include etching the upper hard mask layer using the first patterning mask pattern as an etching mask to form an upper hard mask pattern.

The method may include forming first spacer patterns on sidewalls of the upper hard mask pattern. The method may include removing the upper hard mask pattern. The method may include selectively etching the intermediate hard mask layer using the first spacer patterns as an etching mask to form intermediate hard mask patterns. The method may include removing the first spacer patterns. The method may include forming second spacer patterns on sidewalls of the intermediate hard mask patterns. The method may include removing the intermediate hard mask patterns. The method may include selectively etching the lower hard mask layer using the second spacer patterns as an etching mask to form lower hard mask patterns. The method may include removing the second spacer patterns.

The method may include forming a second patterning mask pattern that exposes a cell area and covers a common source line area on the lower hard mask patterns and the stopper layer. The method may include selectively etching the stopper layer using the lower hard mask patterns and the second patterning mask pattern as etching masks to form stopper patterns.

According to some embodiments, methods of fabricating semiconductor devices may be provided. A method may include forming an etch stop layer, a lower hard mask layer that has an etch selectivity with respect to the etch stop layer, a first intermediate hard mask layer that has an etch selectivity with respect to the lower hard mask layer, a second intermediate hard mask layer that has an etch selectivity with respect to the first intermediate hard mask layer, a first upper hard mask layer that has an etch selectivity with respect to the second intermediate hard mask layer, and a second upper hard mask layer that has an etch selectivity with respect to the first upper hard mask layer on a substrate. The method may include forming a first patterning mask pattern on the second upper hard mask layer. The method may include etching, in a first etch process, the first and second upper hard mask layers using the first patterning mask pattern as an etching mask to expose portions of the second intermediate hard mask layer. The method may include removing the first patterning mask pattern.

The method may include forming a first spacer layer on portions of the first and second upper hard mask layers that remain after the first etch process and on the portions of the second intermediate hard mask layer that are exposed. The method may include partially etching the first spacer layer and removing the second upper hard mask layer in a second etch process to expose the first upper hard mask layer and to form first spacer patterns on sidewalls of the first upper hard mask layer. The method may include removing the first upper hard mask layer from between the first spacer patterns. The method may include etching, in a third etch process, the first and second intermediate hard mask layers using the first spacer patterns as an etching mask to expose portions of the lower hard mask layer. The method may include removing the first spacer patterns.

The method may include forming a second spacer layer on portions of the first and second intermediate hard mask layers that remain after the third etch process and on the portions of the lower hard mask layer that are exposed. The method may include partially etching the second spacer layer and removing the second intermediate hard mask layer in a fourth etch process to expose the first intermediate hard mask layer and to form second spacer patterns on sidewalls of the first intermediate hard mask layer. The method may include removing the first intermediate hard mask layer from between the second spacer patterns. The method may include etching, in a fifth etch process, the lower hard mask layer using the second spacer patterns as an etching mask to expose portions of the etch stop layer. The method may include removing the second spacer patterns.

In some embodiments, the method may include forming a second patterning mask pattern that includes a plurality of openings spaced apart from each other and extending parallel to each other that expose portions of the lower hard mask layer that remain after the fifth etch process and portions of the etch stop layer. The method may include etching, in a sixth etch process, the etch stop layer using the second patterning mask pattern and the portions of the lower hard mask layer that are exposed as etching masks.

In some embodiments, the method may include forming a tunnel dielectric layer and a data storage layer between the substrate and the etch stop layer. The method may include etching, in a seventh etch process, the data storage layer and the tunnel dielectric layer using portions of the etch stop layer remaining after the sixth etch process as an etching mask.

In some embodiments, the first patterning mask pattern may include a plurality of parallel elongated rectangular shaped openings that expose portions of the second upper hard mask layer.

In some embodiments, the first patterning mask pattern may include a plurality of parallel elongated rectangular shapes that cover portions of the second upper hard mask layer.

In some embodiments, spaces in a lateral direction between ones of the second spacer patterns may be approximately equal to thicknesses in the lateral direction of the ones of the second spacer patterns.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIGS. 1A and 1B to 18 are views schematically illustrating intermediate process operations in methods of fabricating semiconductor devices according to some embodiments of the inventive concepts. FIGS. 1A to 14A are top views of a semiconductor device, FIGS. 1B to 14B, and 15 to 18 are cross-sectional views of the semiconductor device taken along line I-I', and FIGS. 11C to 14C are cross-sectional views of the semiconductor device taken along line II-II'.

FIGS. 19A and 19B to 32A and 32B are views schematically illustrating intermediate process operations in methods of fabricating semiconductor devices according to some embodiments of the inventive concepts. FIGS. 19A to 32A are top views of a semiconductor device, FIGS. 19B to 32B are cross-sectional views of the semiconductor device taken along line III-III', and FIGS. 29C to 32C are cross-sectional views of the semiconductor device taken along line VI-VI'.

DETAILED DESCRIPTION

Figure 1A:
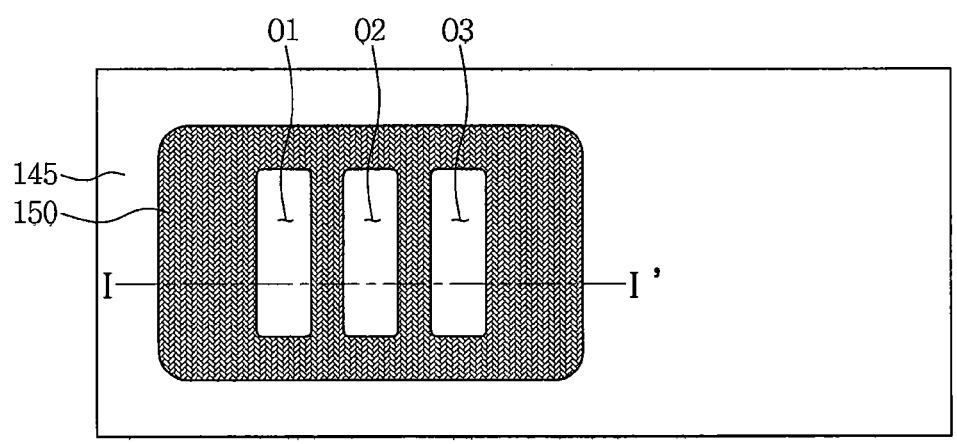

Advantages and features of the inventive concepts, and methods of achieving the same, will be clearly understood with reference to the accompanying drawings and the following detailed embodiments. However, the inventive concepts is not limited to the embodiments to be disclosed, but may be implemented in various different forms. The embodiments are provided in order to fully explain the inventive concepts and fully explain the scope of the inventive concepts to those skilled in the art. Accordingly, the scope of the inventive concepts is defined by the appended claims.

The terminology used here is for describing particular example embodiments only and is not intended to be limiting. As used here, the singular forms "a," "an," and "the" are intended to include plural forms as well unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, and/or components.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

Embodiments of the inventive concepts will be described with reference to cross-sectional views and/or plan views that are exemplary views. Thicknesses of layers and areas may be exaggerated for effective description of the technical contents in the drawings. Forms of the embodiments may be modified by the manufacturing technology and/or tolerance. Therefore, the embodiments of the inventive concepts are not intended to be limited to illustrated specific forms, and include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to limit the scope of the inventive concepts.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

FIGS. 1A and 1B to 18 are views schematically illustrating intermediate process operations in methods of fabricating semiconductor devices according to some embodiments of the inventive concepts. FIGS. 1A to 14A are top views of a semiconductor device, FIGS. 1B to 14B, and 15 to 18 are cross-sectional views of the semiconductor device taken along line I-I', and FIGS. 11C to 14C are-cross sectional views of the semiconductor device taken along line II-II'.

Figure 1B:
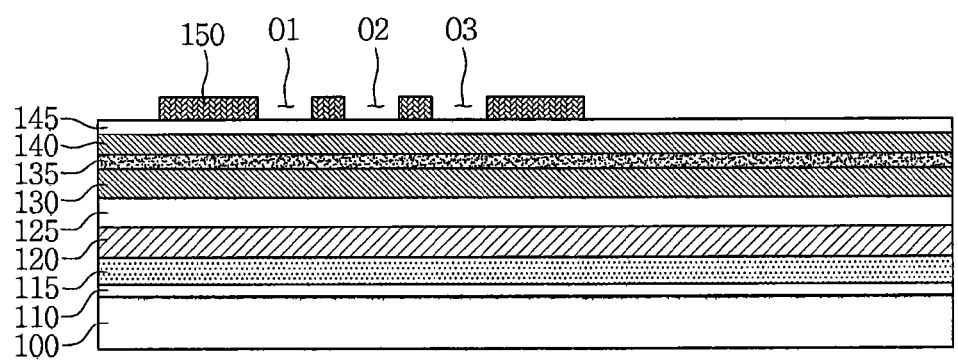

Referring to FIGS. 1A and 1B, methods of fabricating semiconductor devices according to some embodiments of the inventive concepts may include forming a tunnel dielectric layer 110, a data storage layer 115, a stopper layer 120, a lower hard mask layer 125, intermediate hard mask layers 130 and 135, upper hard mask layers 140 and 145, and a first patterning mask pattern 150 on a substrate 100.

The substrate 100 may be a silicon wafer. For example, the substrate 100 may be a single crystalline silicon wafer, a silicon on insulator (SOI) wafer, a compound semiconductor wafer, or an epitaxial silicon wafer that includes carbon, germanium, or the like.

The tunnel dielectric layer 110 may include one of a silicon oxide layer, a silicon oxynitride layer (SiON layer), a nitrogen doped silicon oxide layer, or a high-k dielectric group layer. The high-k dielectric layer may include a dielectric layer that has a higher dielectric constant than a silicon oxide layer, such as an aluminum oxide layer (AlO layer), zirconium oxide layer (ZrO layer), hafnium oxide layer (HfO layer), and lanthanum oxide layer (LaO layer). The tunnel dielectric layer 110 may be formed using a chemical vapor deposition (CVD) or an atom layer deposition (ALD) process.

The data storage layer 115 may store data of a nonvolatile memory device such as a flash memory device, etc. For example, the data storage layer 115 may include a floating gate electrode. The data storage layer 115 may include polysilicon doped with impurities. For example, a polysilicon layer may be deposited by CVD on the tunnel dielectric layer 110, and impurities may be doped into the polysilicon layer to form the data storage layer 115. Otherwise, the data storage layer 115 may be formed by doping impurities while the polysilicon layer is deposited.

The stopper layer 120 may be formed on the data storage layer 115 using CVD. The stopper layer 120 may include an insulator, for example, a silicon oxide layer. The stopper layer 120 may be an etch stop layer.

The lower hard mask layer 125 may have an etch selectivity with respect to the stopper layer 120. For example, the lower hard mask layer 125 may include polysilicon.

The intermediate hard mask layers 130 and 135 may include a first intermediate hard mask layer 130 and a second intermediate hard mask layer 135.

The first intermediate hard mask layer 130 may have an etch selectivity with respect to the lower hard mask layer 125. In addition, the first intermediate hard mask layer 130 may have an etch selectivity with respect to an oxide based material. For example, the first intermediate hard mask layer 130 may include a spin on hard mask (SOH).

The second intermediate hard mask layer 135 may have an etch selectivity with respect to the first intermediate hard mask layer 130. The second intermediate hard mask layer 135 may cap the first intermediate hard mask layer 130. The capping may include forming a layer of a solid material (i.e., a hard material) on a lower layer, that has fluidity (i.e., a soft material), to fix the lower layer. The second intermediate hard mask layer 135 may include silicon oxynitride (SiON). When the second intermediate hard mask layer 135 includes an organic material, the first intermediate hard mask layer 130 may include an inorganic material. In some embodiments, the first intermediate hard mask layer 130 and the second intermediate hard mask layer 135 may be implemented by a combination of an organic material and an inorganic material.

The upper hard mask layers 140 and 145 may include the first upper hard mask layer 140 and the second upper hard mask layer 145.

The first upper hard mask layer 140 may have an etch selectivity with respect to the second intermediate hard mask layer 135. In addition, the first upper hard mask layer 140 may have an etch selectivity with respect to an oxide based material. For example, the first upper hard mask layer 140 may include an SOH.

The second upper hard mask layer 145 may have an etch selectivity with respect to the first upper hard mask layer 140. The second upper hard mask layer 145 may cap the first upper hard mask layer 140. The second upper hard mask layer 145 may include silicon oxynitride (SiON).

The first patterning mask pattern 150 may include openings O1, O2, and O3 that expose respective portions of a surface of the second upper hard mask layer 145. The first patterning mask pattern 150 may include a soft mask of an organic based material, such as a photoresist, or a hard mask of an inorganic based material.

Figure 2A:
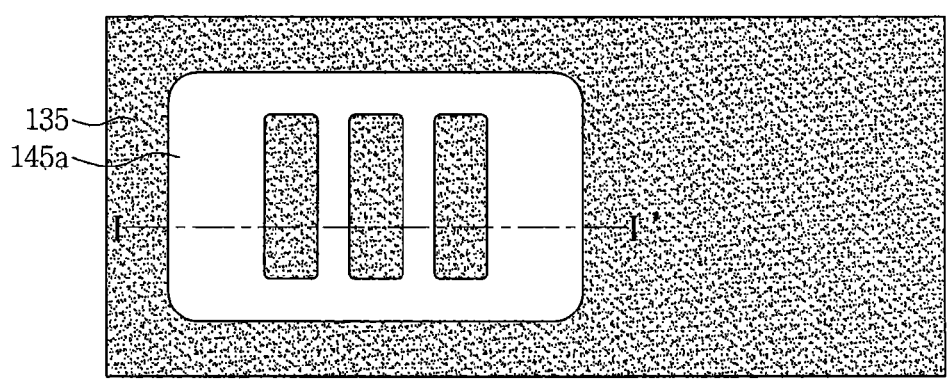
Figure 2B:
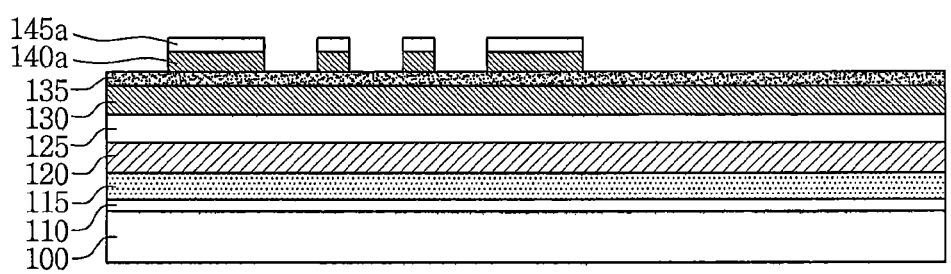

Referring to FIGS. 2A and 2B, methods may include etching the first upper hard mask layer 140 and the second upper hard mask layer 145 using the first patterning mask pattern 150 as an etching mask to form a first upper hard mask pattern 140a and a second upper hard mask pattern 145a that expose portions of a surface of the second intermediate hard mask layer 135. The first patterning mask pattern 150 may be removed.

Figure 3A:
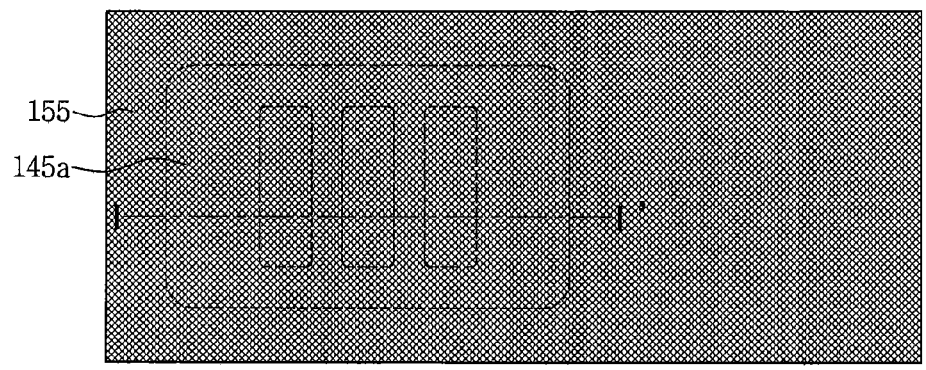
Figure 3B:
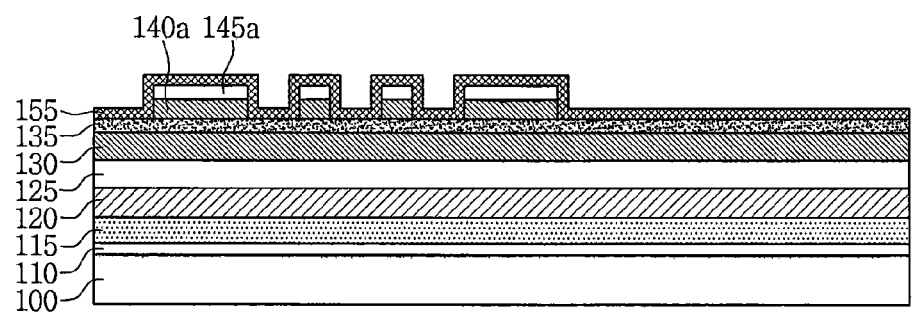

Referring to FIGS. 3A and 3B, methods may include forming a first spacer layer 155 that covers an exposed surface of the second intermediate hard mask layer 135, the first upper hard mask pattern 140a, and the second upper hard mask pattern 145a. The first spacer layer 155 may include silicon oxide.

Figure 4A:
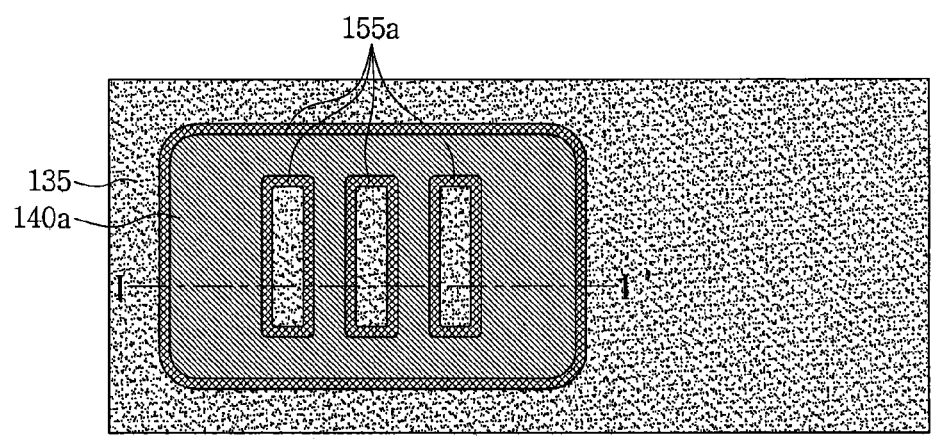
Figure 4B:
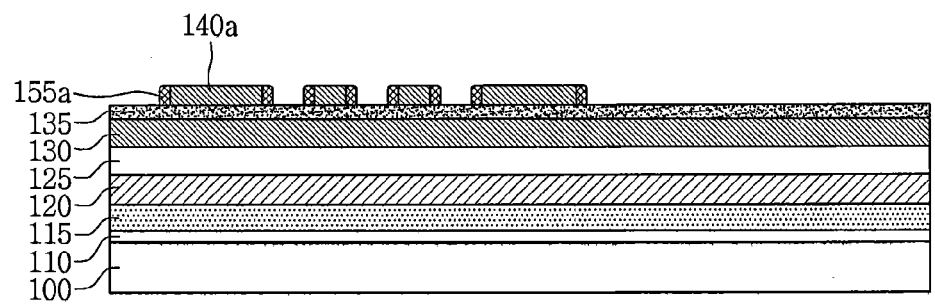

Referring to FIGS. 4A and 4B, methods may include etching the first spacer layer 155 to form first spacer patterns 155a. The first spacer patterns 155a may be formed by performing an etch-back process. The first spacer patterns 155a may be formed in a spacer shape on sidewalls of the first upper hard mask patterns 140a. In this process, all or most of the second upper hard mask pattern 145a may be removed, and the second intermediate hard mask layer 135 and the first upper hard mask patterns 140a may be exposed. The first spacer patterns 155a may form ring shapes that surround sidewalls of the first upper hard mask patterns 140a.

Figure 5A:
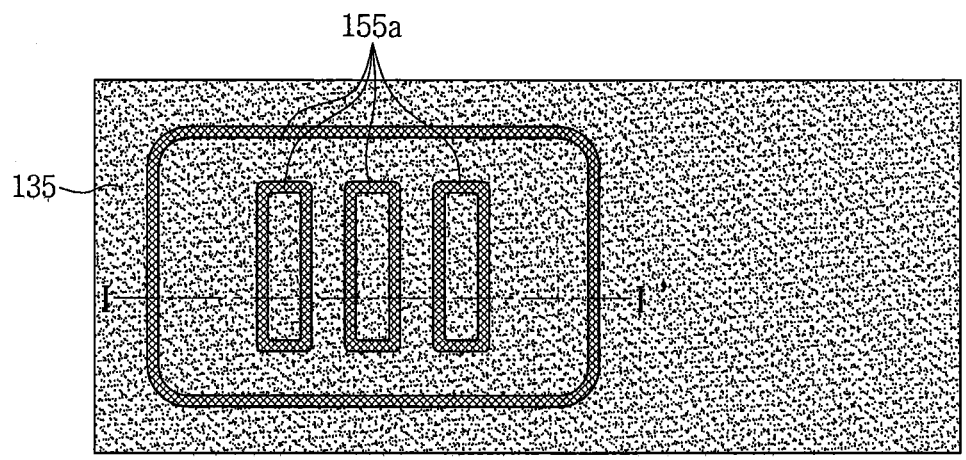
Figure 5B:
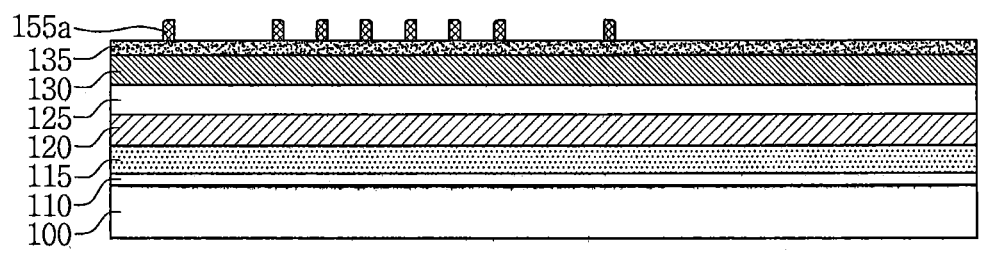

Referring to FIGS. 5A and 5B, methods may include removing the first upper hard mask pattern 140a that is exposed between the first spacer patterns 155a to expose portions of the second intermediate hard mask layer 135 that were covered by the first upper hard mask pattern 140a.

Figure 6A:
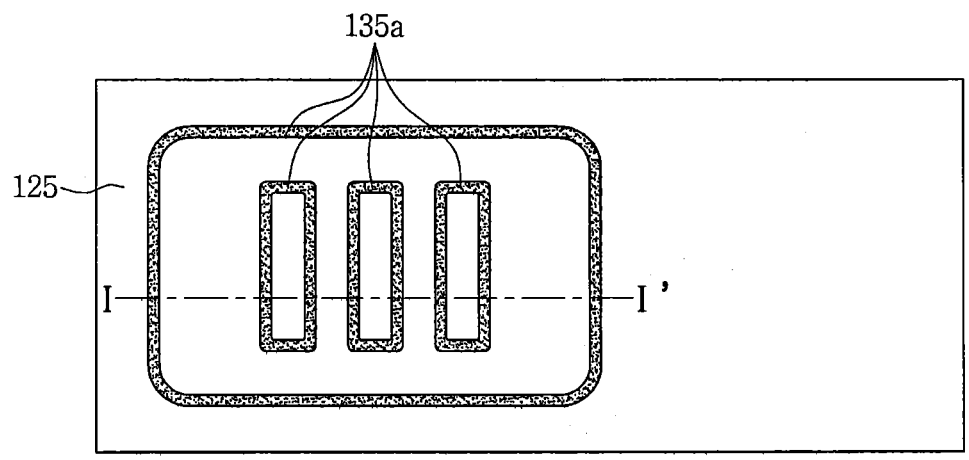
Figure 6B:
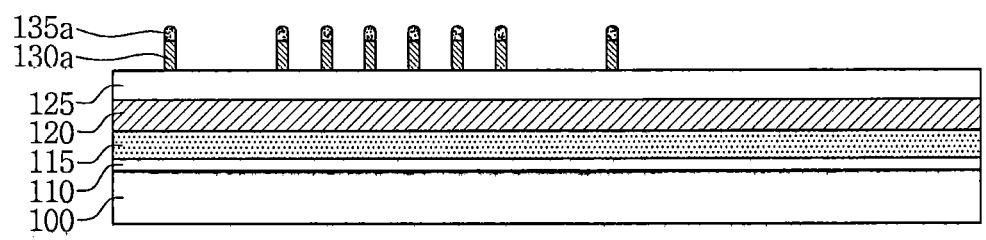

Referring to FIGS. 6A and 6B, methods may include etching the first intermediate hard mask layer 130 and the second intermediate hard mask layer 135 using the first spacer patterns 155a as an etching mask to form first intermediate hard mask patterns 130a and second intermediate hard mask patterns 135a that expose portions of a surface of the lower hard mask layer 125. The first spacer patterns 155a may be removed.

Figure 7A:
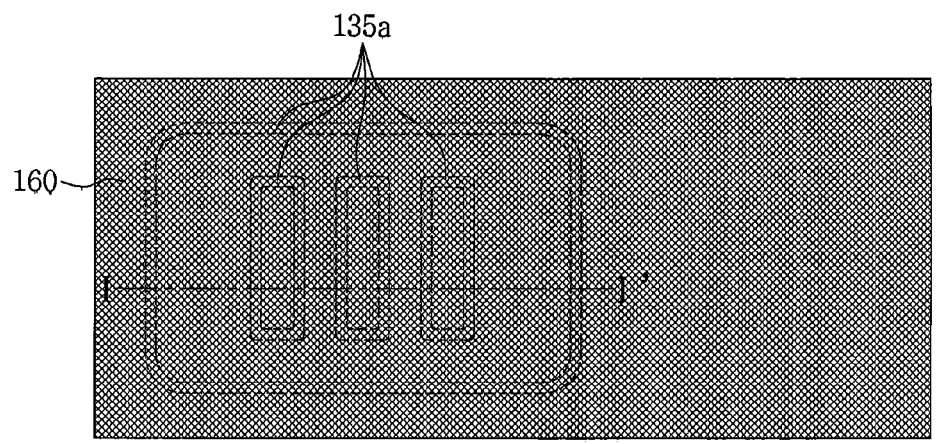
Figure 7B:
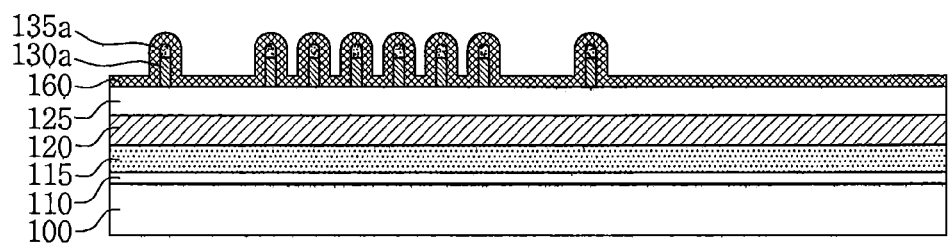

Referring to FIGS. 7A and 7B, methods may include forming a second spacer layer 160 that covers an exposed surface of the lower hard mask layer 125, the first intermediate hard mask patterns 130a, and the second intermediate hard mask patterns 135a. The second spacer layer 160 may include silicon oxide. The second spacer layer 160 may have thicknesses and spaces formed to be similar or the same in a lateral direction. In other words, a quadruple patterning technology that may improve resolution by, for example, four times may be implemented that produces the second spacer layer 160 wherein widths in a lateral direction of spaces formed between ones of spacers of the second spacer layer 160 may be approximately equal to thicknesses in the lateral direction of the ones of the spacers of the second spacer layer 160.

Figure 8A:
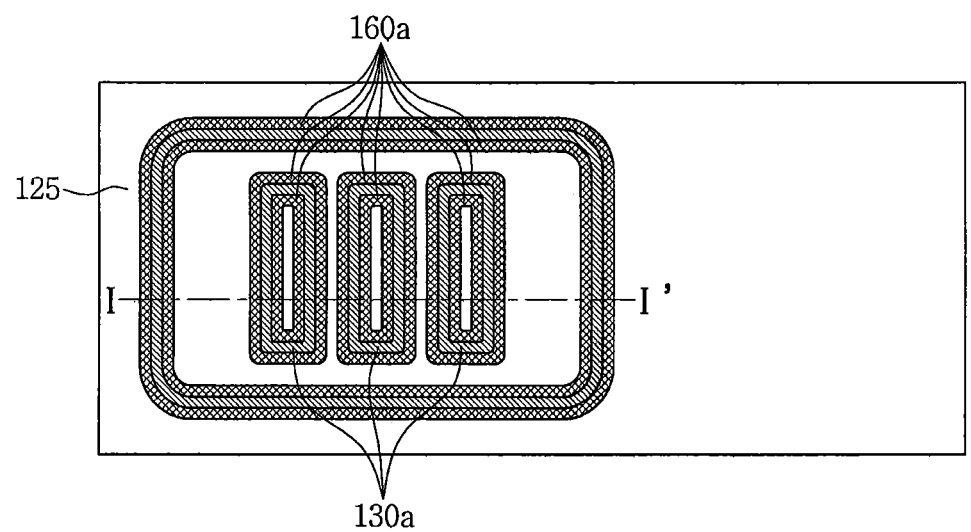
Figure 8B:
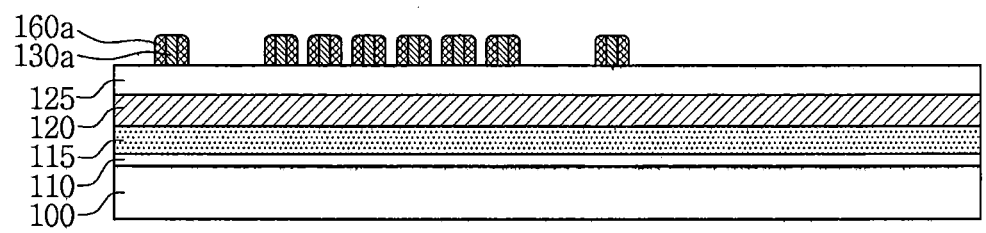

Referring to FIGS. 8A and 8B, methods may include etching the second spacer layer 160 to form second spacer patterns 160a. The second spacer patterns 160a may be formed by performing an etch-back process. The second spacer patterns 160a may be formed in a spacer shape on sidewalls of the first intermediate hard mask patterns 130a. In this process, all or most of the second intermediate hard mask patterns 135a may be removed, and the lower hard mask layer 125 and the first intermediate hard mask patterns 130a may be exposed. The second spacer patterns 160a may form ring shapes that surround sidewalls of the first intermediate hard mask patterns 130a.

Figure 9A:
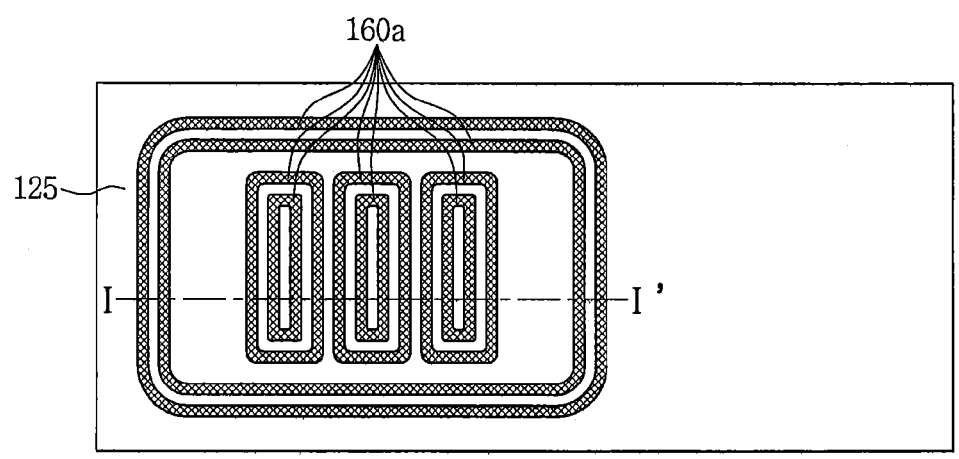
Figure 9B:
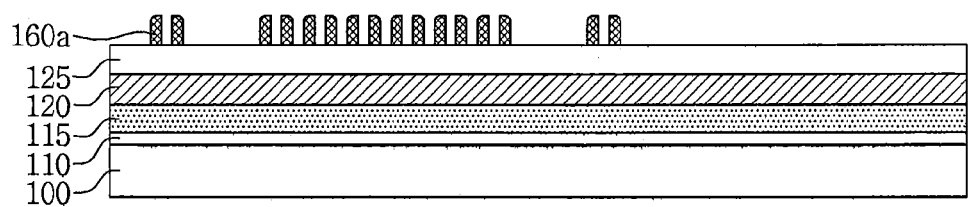

Referring to FIGS. 9A and 9B, methods may include removing the first intermediate hard mask patterns 130a exposed between the second spacer patterns 160a to expose the portions of the lower hard mask layer 125 that were covered by the first intermediate hard mask patterns 130a.

Figure 10A:
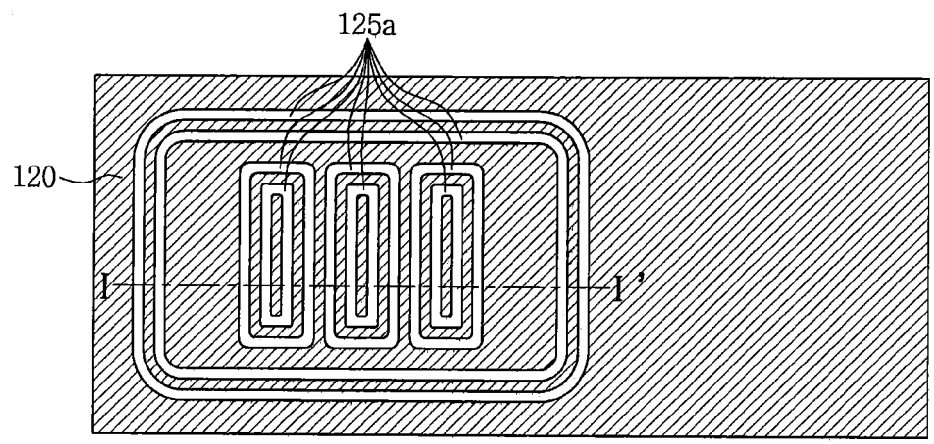
Figure 10B:
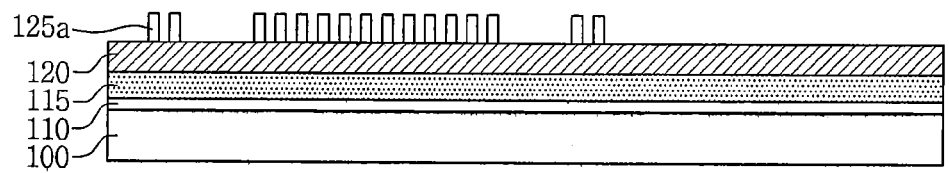

Referring to FIGS. 10A and 10B, methods may include etching the lower hard mask layer 125 using the second spacer patterns 160a as an etching mask to form lower hard mask patterns 125a that expose portions of a surface of the stopper layer 120. The second spacer patterns 160a may be removed.

Figure 11A:
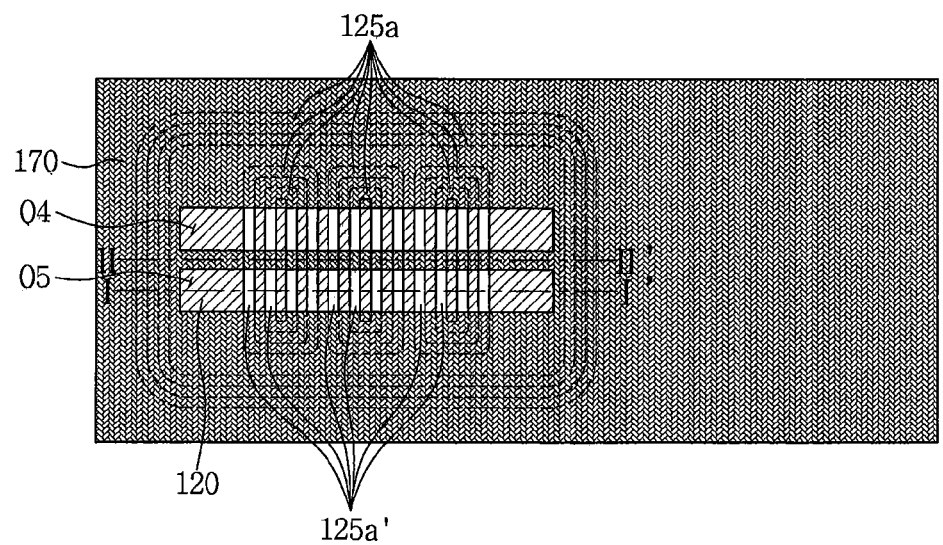
Figure 11B:
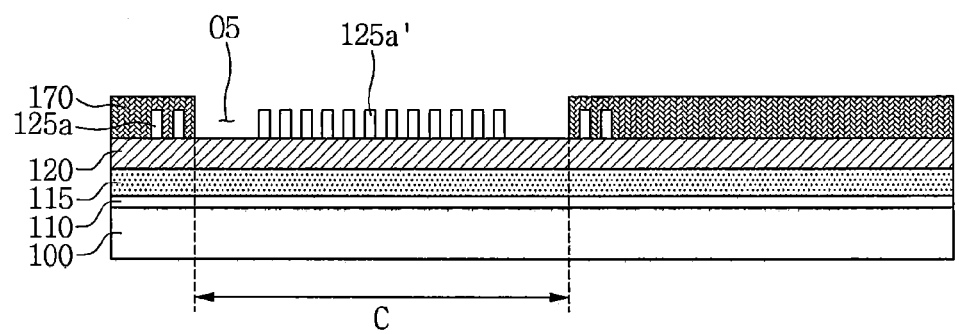
Figure 11C:
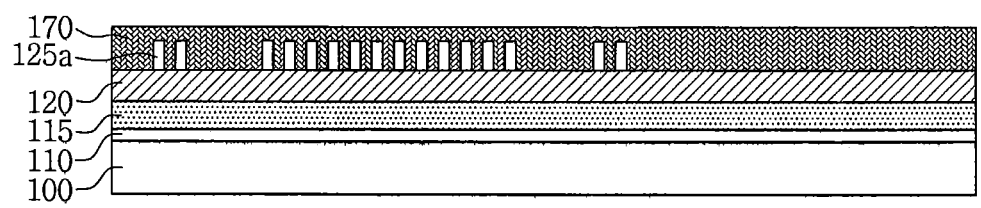

Referring to FIGS. 11A, 11B, and 11C, methods may include forming a second patterning mask pattern 170 on the lower hard mask patterns 125a that expose portions of a surface of the stopper layer 120. The second patterning mask pattern 170 may expose a cell area C and may cover a common source line area. The second patterning mask pattern 170 may include opening patterns O4 and O5 that may expose respective portions of a surface of the stopper layer 120 and may expose respective portions of the lower hard mask patterns 125a'. Therefore, the lower hard mask patterns 125a and 125a' may be classified as the exposed lower hard mask patterns 125a' and the masked lower hard mask patterns 125a. The second patterning mask pattern 170 may include a soft mask of an organic based material, such as a photoresist, or a hard mask of an inorganic based material. The second patterning mask pattern 170 may define the cell area C using the opening patterns O4 and O5. The second patterning mask pattern 170 may commonly form an active area of the cell area C. That is, referring to FIG. 11C, the second patterning mask pattern 170 may cover a surface of the stopper layer 120 and the lower hard mask patterns 125a to commonly form an active area that may be used as a common source line.

Figure 12A:
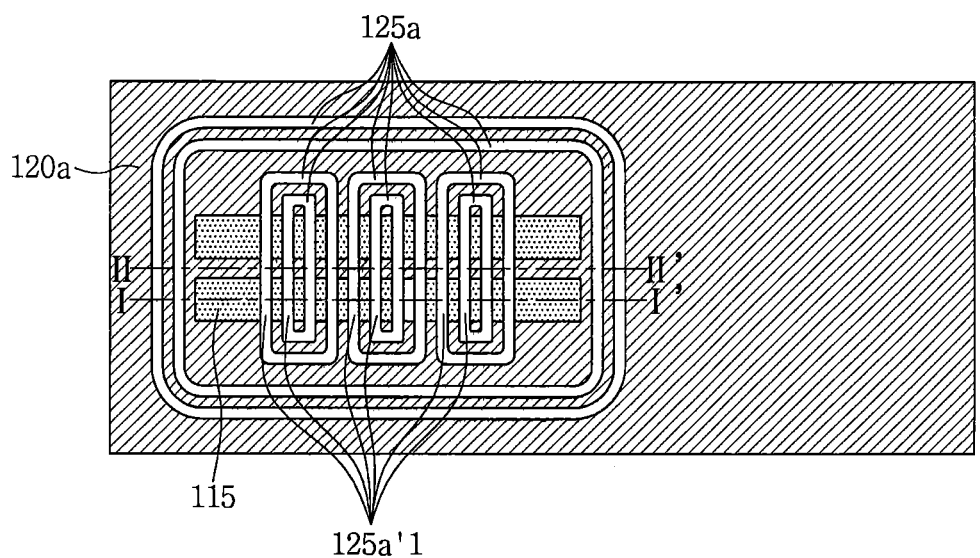
Figure 12B:
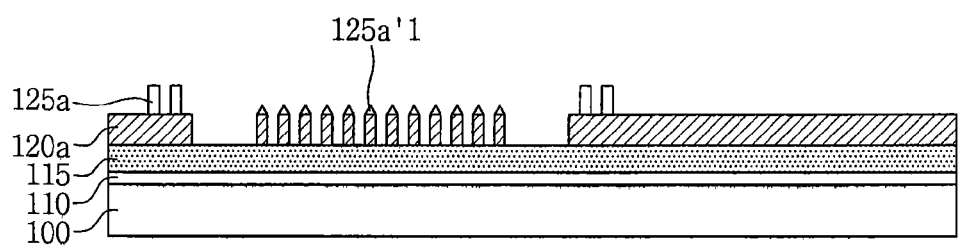
Figure 12C:
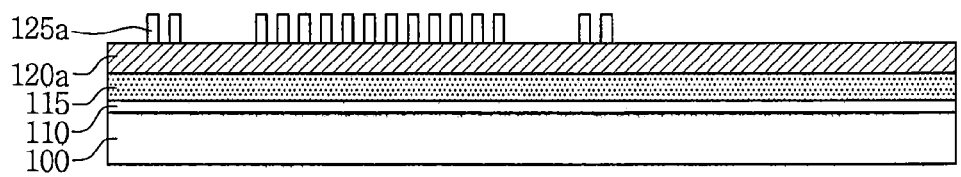

Referring to FIGS. 12A, 12B, and 12C, methods may include etching the stopper layer 120 using the second patterning mask pattern 170 as an etching mask to form stopper patterns 120a that expose portions of a surface of the data storage layer 115. Specifically, the stopper patterns 120a that expose the portions of the data storage layer 115 may be formed by etching the stopper layer 120 using the second patterning mask pattern 170 and the lower hard mask patterns 125a and 125a' as etching masks. The second patterning mask pattern 170 may be removed. The lower hard mask patterns 125a' that are exposed by the opening patterns O4 and O5 may not be removed completely and may remain as thinned lower hard mask patterns 125a'1. The lower hard mask patterns 125a of an area that is masked by the second patterning mask pattern 170 may remain as they are.

Figure 13A:
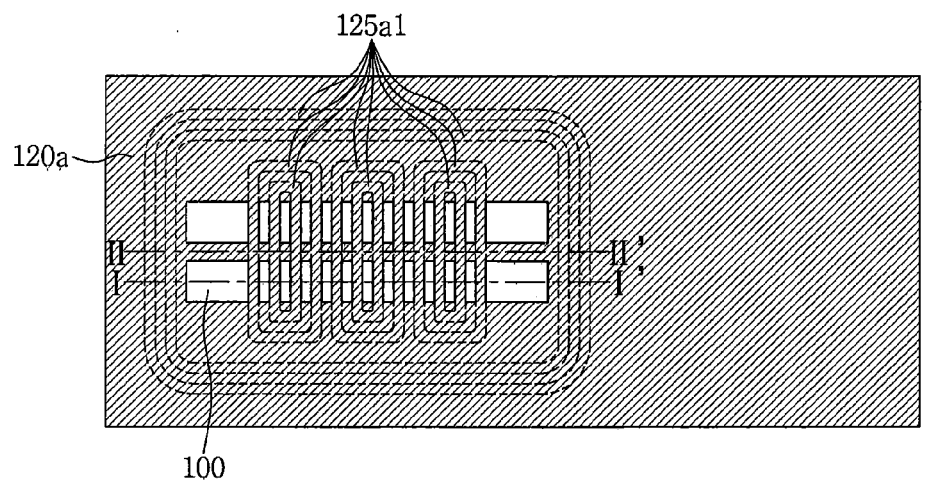
Figure 13B:
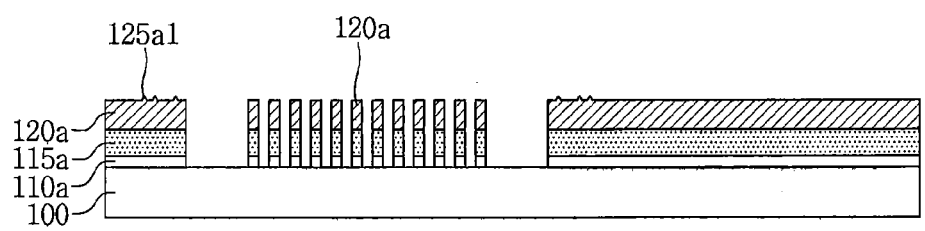
Figure 13C:
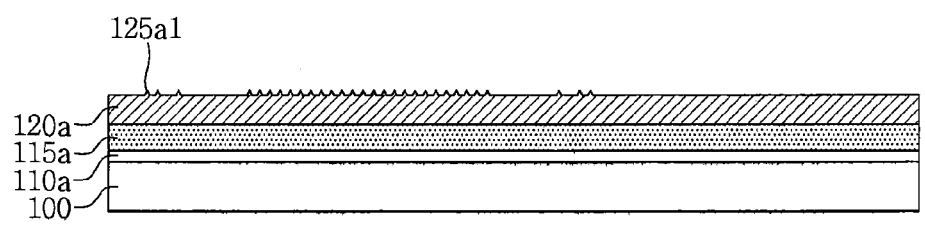

Referring to FIGS. 13A, 13B, and 13C, methods may include etching the data storage layer 115 and the tunnel dielectric layer 110 in the cell area C using the stopper patterns 120a as an etching mask to form data storage layer patterns 115a and tunnel dielectric layer patterns 110a, that expose portions of a surface of the substrate 100. The remaining thinned lower hard mask patterns 125a'1 that are exposed by the opening patterns O4 and O5 may be removed completely, and the stopper patterns 120a may be exposed entirely. The lower hard mask patterns 125a of an area that is masked by the second patterning mask pattern 170 may not be removed completely and may remain as thinned lower hard mask patterns 125a1.

Figure 14A:
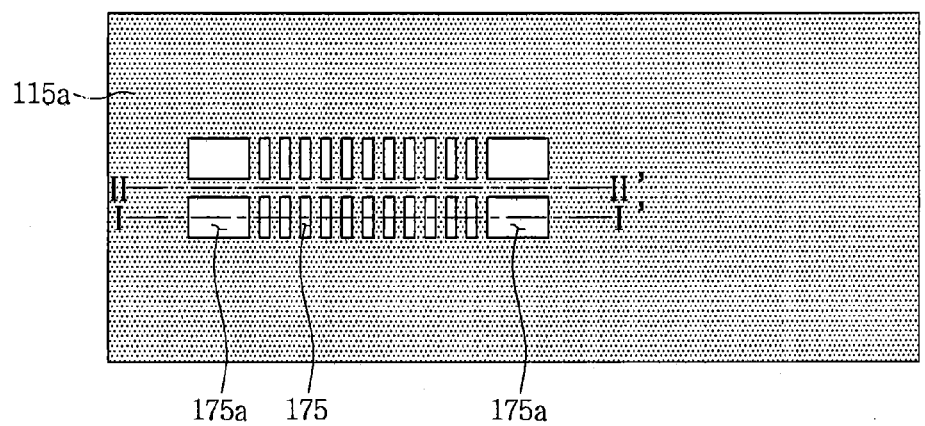
Figure 14B:
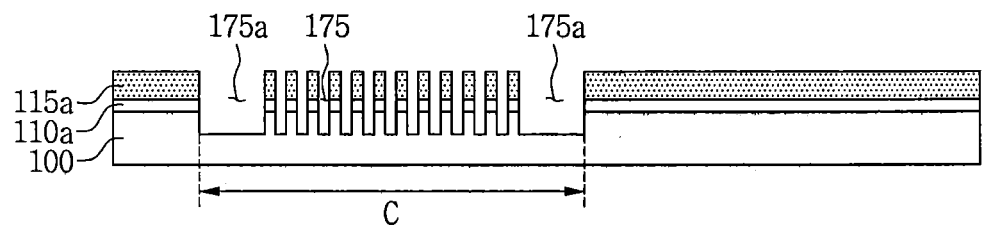
Figure 14C:
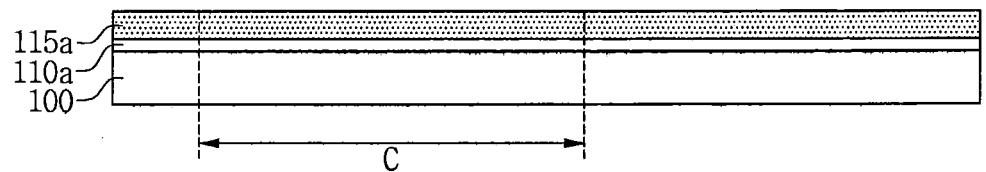

Referring to FIGS. 14A, 14B, and 14C, methods may include etching the substrate 100 using the stopper patterns 120a, the data storage layer patterns 115a, and the tunnel dielectric layer patterns 110a as etching masks to form cell trenches 175. Simultaneously, the remaining thinned lower hard mask patterns 125a1 and the stopper patterns 120a may be removed. In a top view, the trenches 175 may have a rod shape or a bar shape. As used herein, a top view may refer to a plan view of the semiconductor device. In other words, in a plan view, the trenches 175 may have an elongated rectangular shape. A dummy area 175a may be formed in an edge of the cell area C. Referring to FIG. 14C, the active area in the cell area C may be formed commonly. In other words, the cell area C may include two rows of trenches 175 with a common active area therebetween. The active area that is formed commonly may be used as a common source line. Therefore, in a subsequent process, the common source line (CSL) may be formed without regard to the contact size of a cell.

Figure 15:
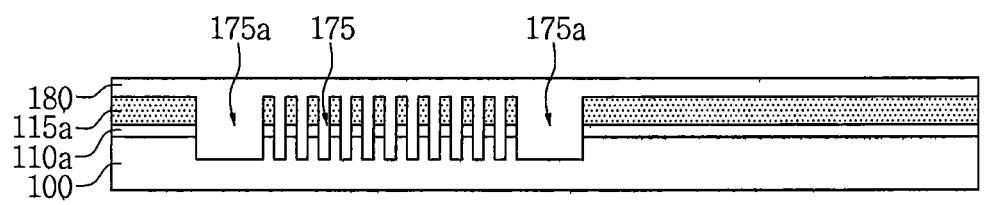

Referring to FIG. 15, methods may include forming a core stopper layer 180 on the substrate 100 and on the data storage layer patterns 115a. The core stopper layer 180 may be formed of a material that has good fluidity and cap filling characteristics. For example, in some embodiments, the core stopper layer 180 may be formed by a coating method. The core stopper layer 180 may be formed of silazene material, and, more specifically, may be formed of tonen silazene (TOSZ).

Figure 16:
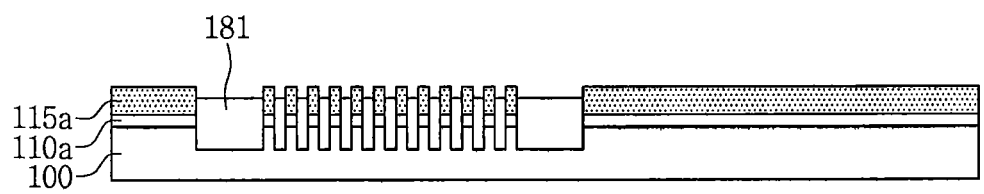

Referring to FIG. 16, methods may include performing an etch-back process to recess the core stopper layer 180 to form a cell filling insulator 181 that fills an inside of the cell trenches 175.

Figure 17:
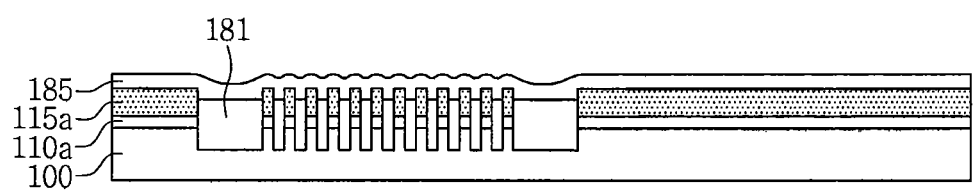

Referring to FIG. 17, methods may include forming a dielectric layer 185 on the cell filling insulator 181. The dielectric layer 185 may be formed by a CVD or an ALD process. For example, the dielectric layer 185 may have a multilayer of $SiO_2$/SiN/$SiO_2$ (ONO).

Figure 18:
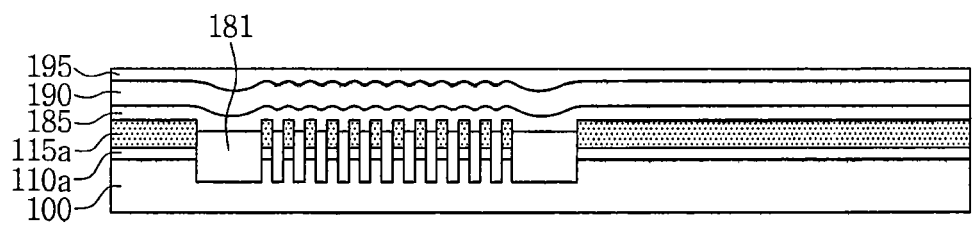

Referring to FIG. 18, methods may include forming a control gate electrode layer 190 and capping insulating layer 195 on the dielectric layer 185. The control gate electrode layer 190 may be formed of a metal, a metal silicide, or a semiconductor layer that is doped with impurities. The capping insulating layer 195 may be formed of an insulator, for example, silicon oxide, silicon nitride, or silicon oxynitride. Other subsequent processes may be further performed.

FIGS. 19A and 19B to 32A and 32B are views schematically illustrating intermediate process operations in methods of fabricating semiconductor devices according to some embodiments of the inventive concepts. FIGS. 19A to 32B are top views of a semiconductor device, FIGS. 19B to 32B are cross-sectional views of the semiconductor device taken along line III-III', and FIGS. 29C to 32C are cross-sectional views of the semiconductor device taken along line VI-VI'.

Figure 19A:
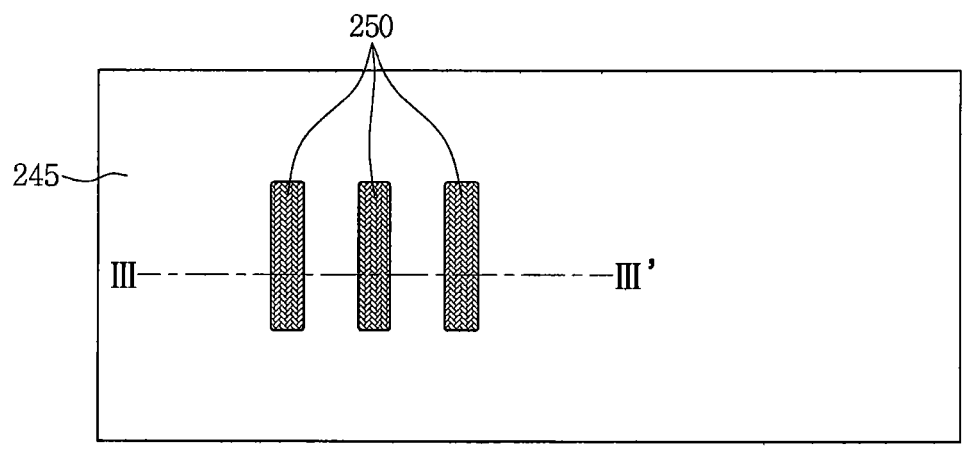
Figure 19B:
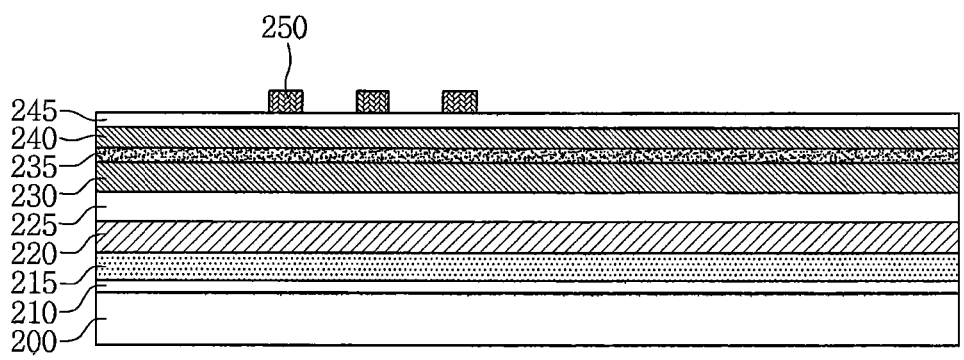

Referring to FIGS. 19A and 19B, methods may include forming a tunnel dielectric layer 210, a data storage layer 215, a stopper layer 220, a lower hard mask layer 225, intermediate hard mask layers 230 and 235, upper hard mask layers 240 and 245, and a first patterning mask pattern 250 on a substrate 200.

The substrate 200 may be a silicon wafer, for example, a single crystalline silicon wafer, an SOI wafer, a compound semiconductor wafer, or an epitaxial silicon wafer that includes carbon, germanium, or the like.

The tunnel dielectric layer 210 may include one of a silicon oxide layer, a silicon oxynitride layer (SiON layer), a nitrogen doped silicon oxide layer, or a high-k dielectric group layer. The high-k dielectric layer may include a dielectric layer, such as an aluminum oxide layer (AlO layer), zirconium oxide layer (ZrO layer), hafnium oxide layer (HfO layer), and lanthanum oxide layer (LaO layer), etc., that has a higher dielectric constant than a silicon oxide layer. The tunnel dielectric layer 210 may be formed using a chemical vapor deposition (CVD) or an atom layer deposition (ALD) process.

The data storage layer 215 may store data of a nonvolatile memory device such as a flash memory device, etc. For example, the data storage layer 215 may include a floating gate electrode. The data storage layer 215 may include polysilicon doped with impurities. For example, a polysilicon layer may be deposited by CVD on the tunnel dielectric layer 210, and impurities may be doped into the polysilicon layer to form the data storage layer 215. Otherwise, the data storage layer 215 may be formed by doping impurities while the polysilicon layer is deposited.

The stopper layer 220 may be formed on the data storage layer 215 using CVD. The stopper layer 220 may include a silicon oxide layer.

The lower hard mask layer 225 may have an etch selectivity with respect to the stopper layer 220. For example, the lower hard mask layer 225 may include polysilicon. The intermediate hard mask layers 230 and 235 may include a first intermediate hard mask layer 230 and a second intermediate hard mask layer 235.

The first intermediate hard mask layer 230 may have an etch selectivity with respect to the lower hard mask layer 225. In addition, the first intermediate hard mask layer 230 may have an etch selectivity with respect to an oxide based material. For example, the first intermediate hard mask layer 230 may include an SOH.

The second intermediate hard mask layer 235 may have an etch selectivity with respect to the first intermediate hard mask layer 230. The second intermediate hard mask layer 235 may cap the first intermediate hard mask layer 230. The capping may include forming a layer of a solid material (i.e., a hard material) on a lower layer, that has fluidity (i.e., a soft material), to fix the lower layer. The second intermediate hard mask layer 235 may include silicon oxynitride (SiON). When the second intermediate hard mask layer 235 includes an organic material, the first intermediate hard mask layer 230 may include an inorganic material. In some embodiments, the first intermediate hard mask layer 230 and the second intermediate hard mask layer 235 may be implemented by a combination of an organic material and an inorganic material.

The upper hard mask layers 240 and 245 may include a first upper hard mask layer 240 and a second upper hard mask layer 245. The first upper hard mask layer 240 may have an etch selectivity with respect to the second intermediate hard mask layer 235. In addition, the first upper hard mask layer 240 may have an etch selectivity with respect to an oxide based material. For example, the first upper hard mask layer 240 may include an SOH. The second upper hard mask layer 245 may have an etch selectivity with respect to the first upper hard mask layer 240. The second upper hard mask layer 245 may cap the first upper hard mask layer 240. The second upper hard mask layer 245 may include silicon oxynitride (SiON).

The first patterning mask pattern 250 may include bar shapes that mask respective portions of a surface of the second upper hard mask layer 245. The first patterning mask patterns 250 may include a soft mask of an organic based material, such as a photoresist, or a hard mask of an inorganic based material.

Figure 20A:
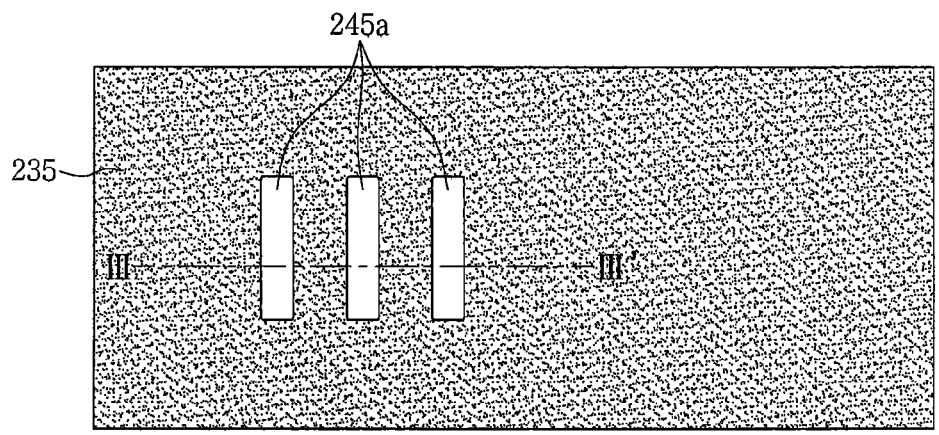
Figure 20B:
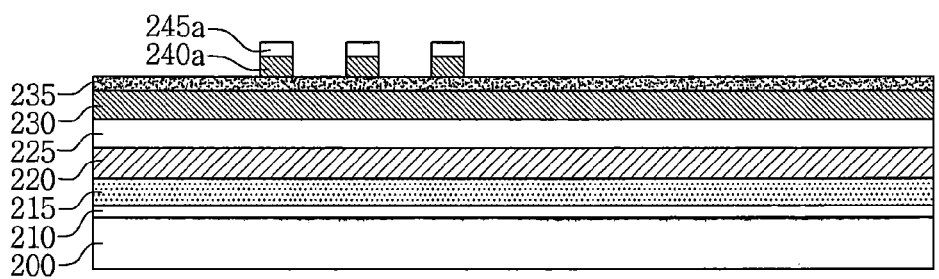

Referring to FIGS. 20A and 20B, methods may include etching the first upper hard mask layer 240 and the second upper hard mask layer 245 using the first patterning mask patterns 250 as an etching mask to form first upper hard mask patterns 240a and second upper hard mask patterns 245a that mask respective portions of a surface of the second intermediate hard mask layer 235. The first patterning mask patterns 250 may be removed.

Figure 21A:
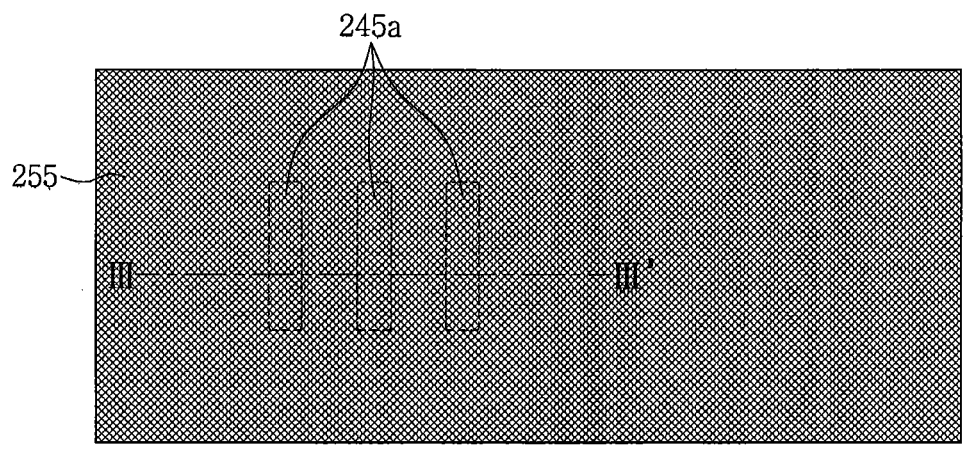
Figure 21B:
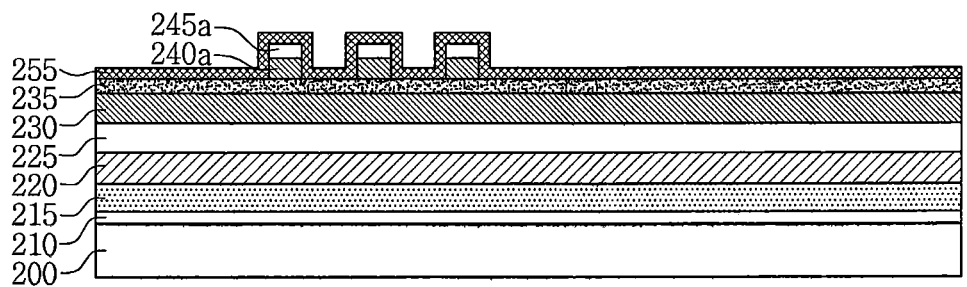

Referring to FIGS. 21A and 21B, methods may include forming a first spacer layer 255 that covers an exposed surface of the second intermediate hard mask layer 235, the first upper hard mask patterns 240a, and the second upper hard mask patterns 245a. The first spacer layer 255 may include silicon oxide.

Figure 22A:
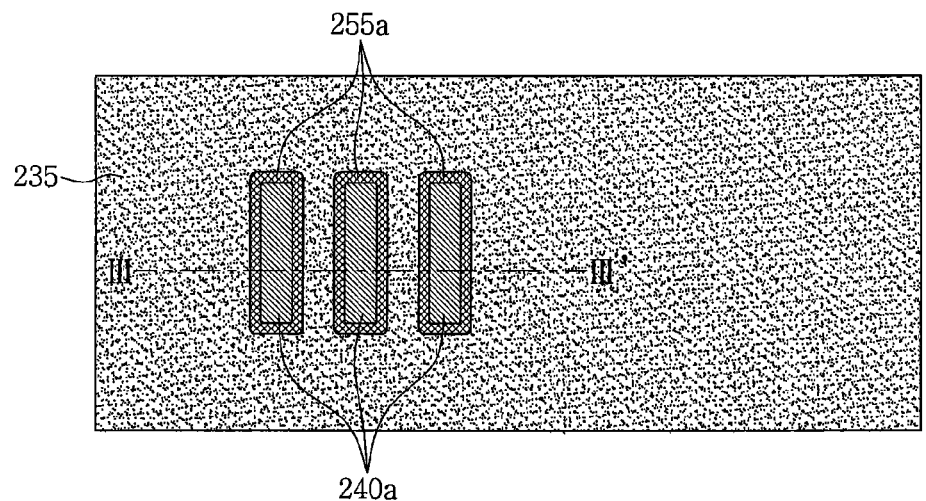
Figure 22B:
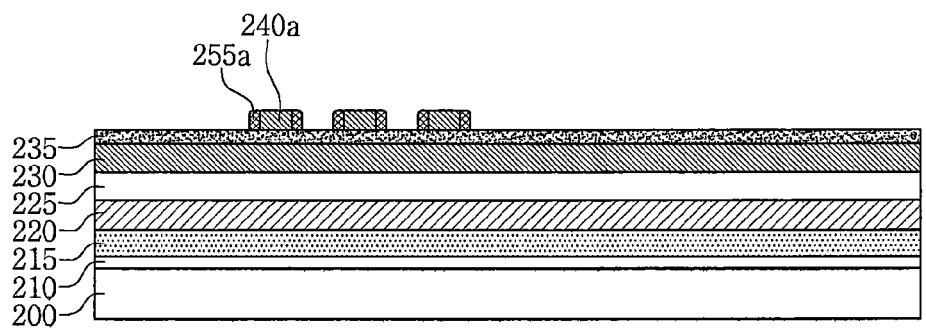

Referring to FIGS. 22A and 22B, methods may include etching the first spacer layer 255 to form first spacer patterns 255a. The first spacer patterns 255a may be formed by performing an etch-back process. In a cross-sectional view, the first spacer patterns 255a may be formed in a spacer shape on sidewalls of the first upper hard mask patterns 240a. In this process, all or most of the second upper hard mask patterns 245a may be removed, and the second intermediate hard mask layer 235 and the first upper hard mask patterns 240a may be exposed. In a top view, the first spacer patterns 255a may have ring shapes that surround sidewalls of the first upper hard mask patterns 240a.

Figure 23A:
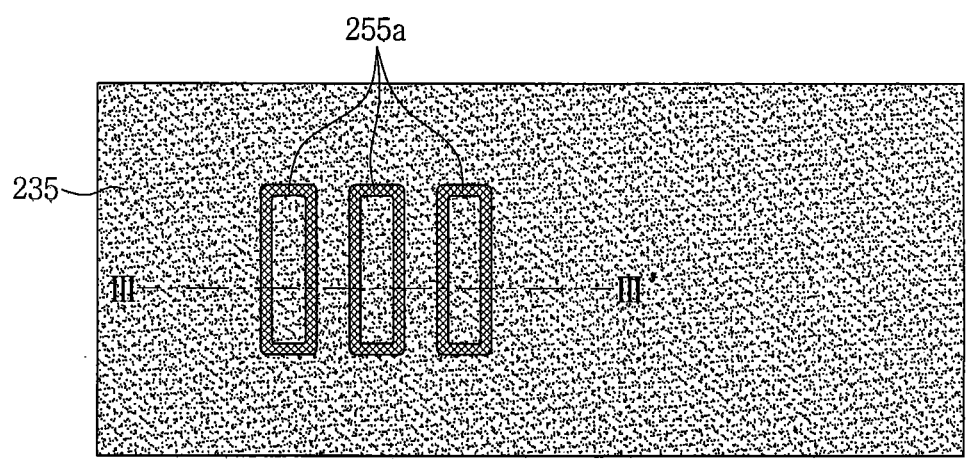
Figure 23B:
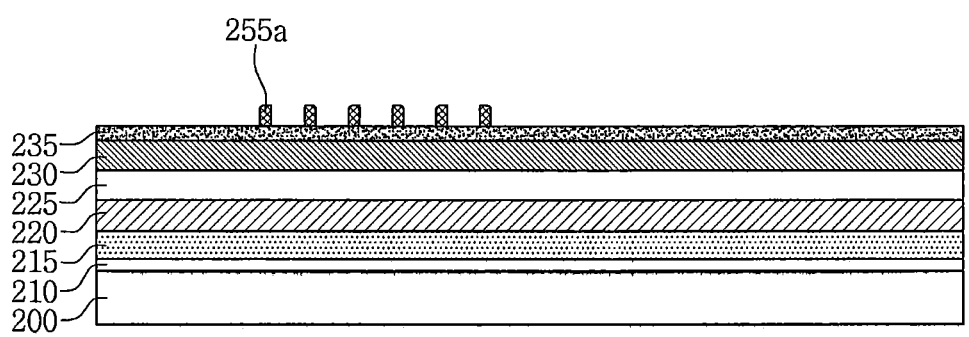

Referring to FIGS. 23A and 23B, methods may include removing the first upper hard mask patterns 240a that are exposed between the first spacer patterns 255a to expose portions of the second intermediate hard mask layer 235 that were covered by the first upper hard mask patterns 240a.

Figure 24A:
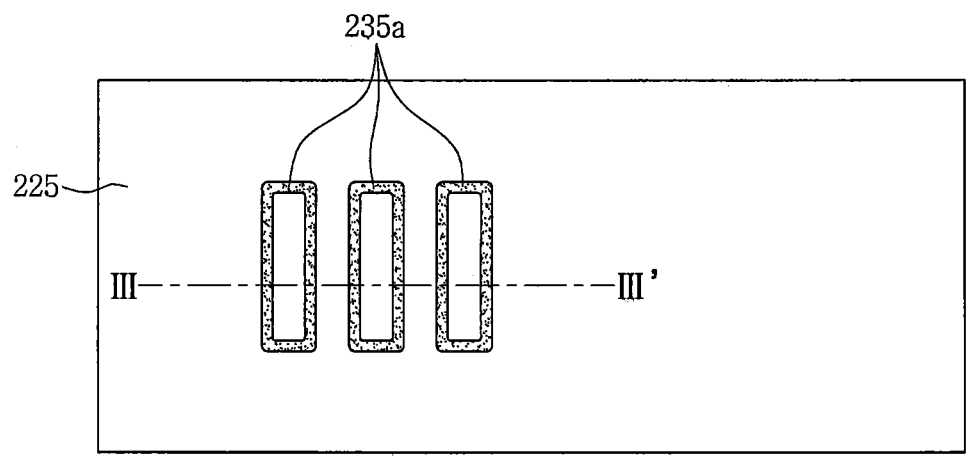
Figure 24B:
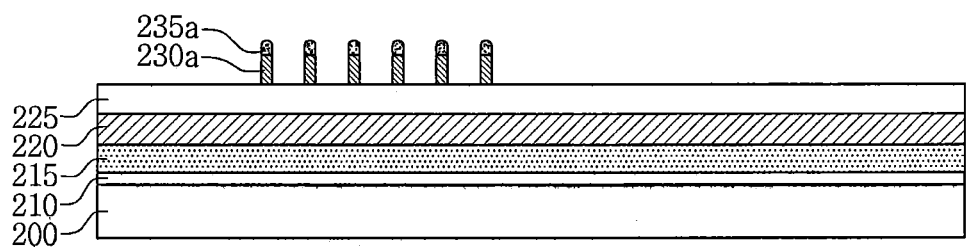

Referring to FIGS. 24A and 24B, methods may include etching the first intermediate hard mask layer 230 and the second intermediate hard mask layer 235 using the first spacer patterns 255a as an etching mask to form first intermediate hard mask patterns 230a and second intermediate hard mask patterns 235a that expose respective portions of a surface of the lower hard mask layer 225. The first spacer patterns 255a may be removed.

Figure 25A:
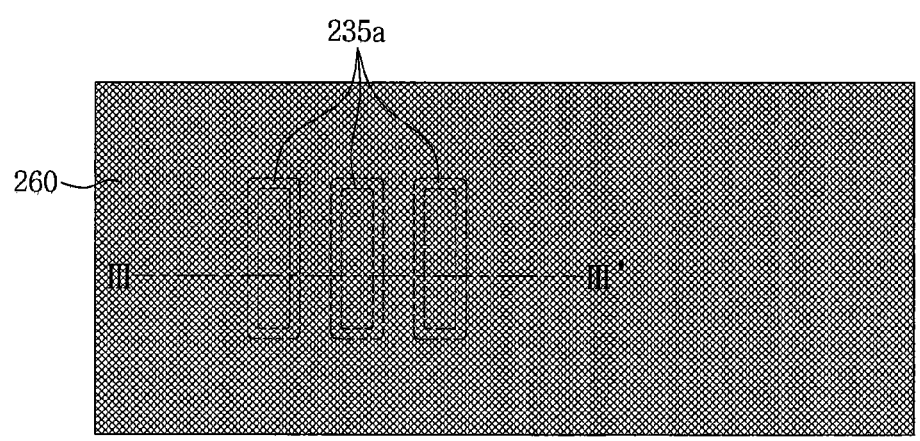
Figure 25B:
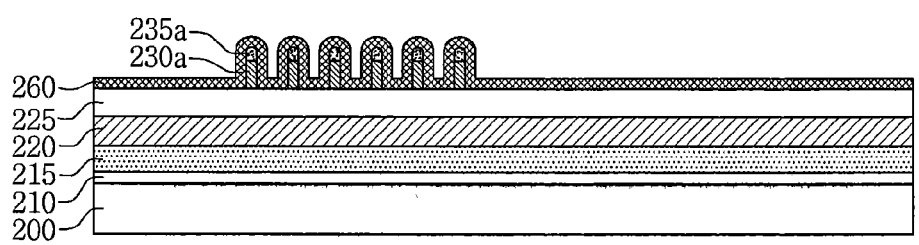

Referring to FIGS. 25A and 25B, methods may include forming a second spacer layer 260 that covers an exposed surface of the lower hard mask layer 225, the first intermediate hard mask patterns 230a, and the second intermediate hard mask patterns 235a. The second spacer layer 260 may include silicon oxide. The second spacer layer 260 may have thicknesses and spaces formed to be similar or the same in a lateral direction.

Figure 26A:
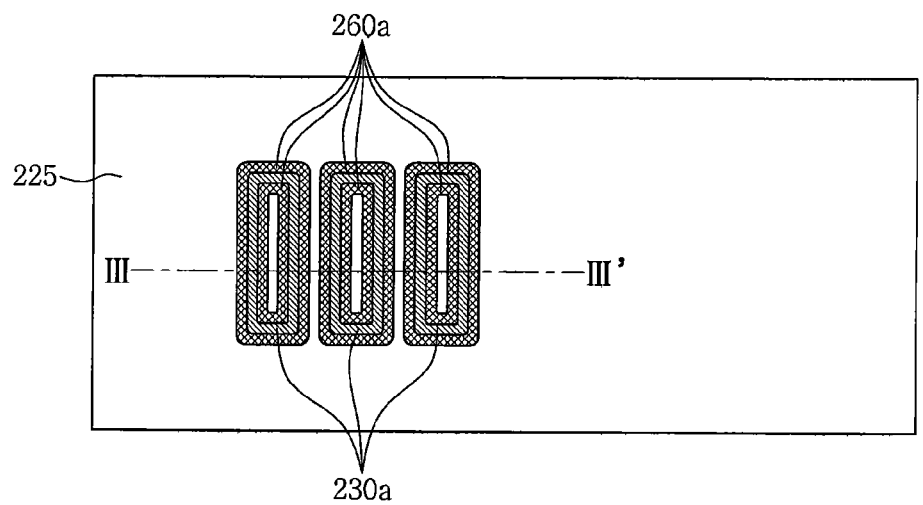
Figure 26B:
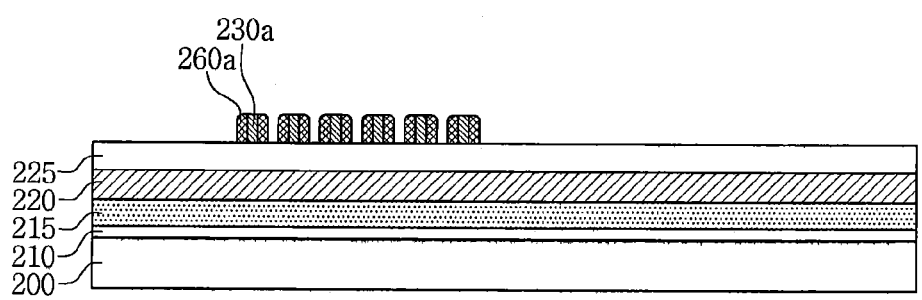

Referring to FIGS. 26A and 26B, methods may include etching the second spacer layer 260 to form second spacer patterns 260a. The second spacer patterns 260a may be formed by performing an etch-back process. The second spacer patterns 260a may be formed in a spacer shape on sidewalls of the first intermediate hard mask pattern 230a. In this process, all or most of the second intermediate hard mask patterns 235a may be removed, and the lower hard mask layer 225 and the first intermediate hard mask patterns 230a may be exposed. In a top view, the second spacer patterns 260a may have ring shapes that surround sidewalls of the first intermediate hard mask patterns 230a.

Figure 27A:
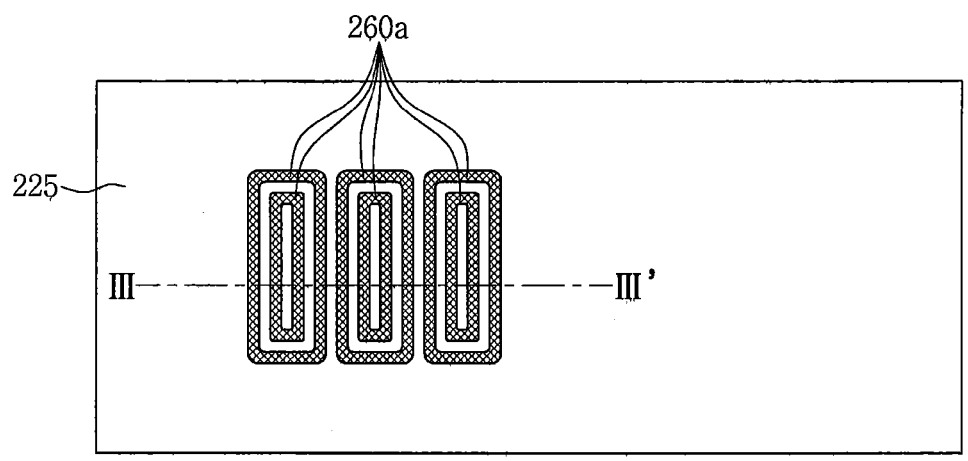
Figure 27B:
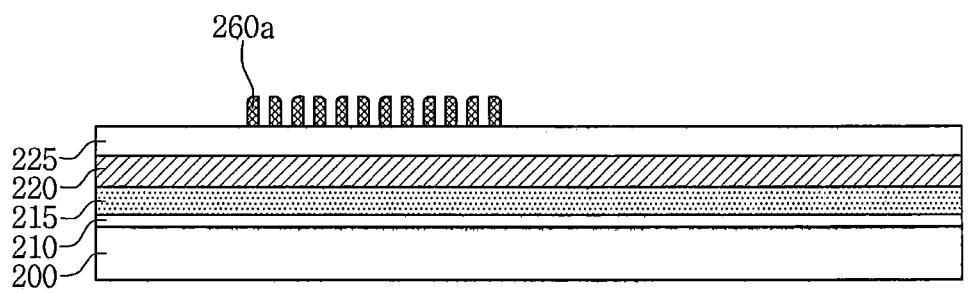

Referring to FIGS. 27A and 27B, methods may include removing the first intermediate hard mask patterns 230a that are exposed between the second spacer patterns 260a to expose the lower hard mask layer 225.

Figure 28A:
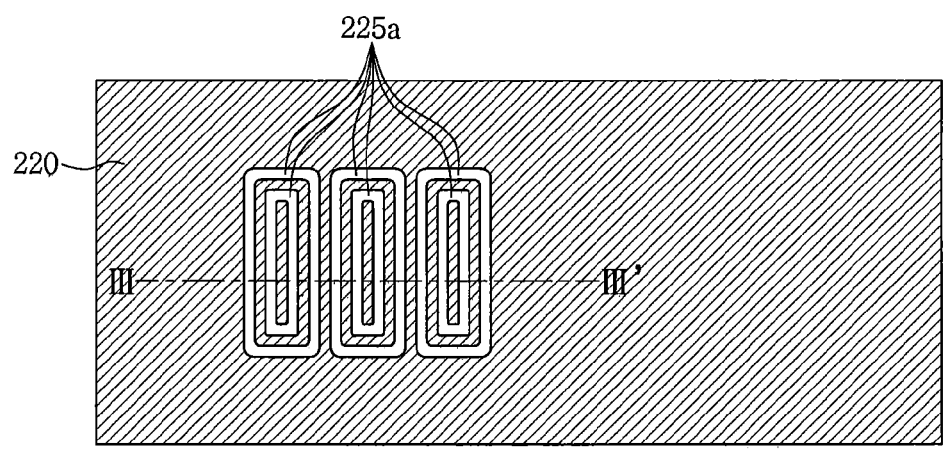
Figure 28B:
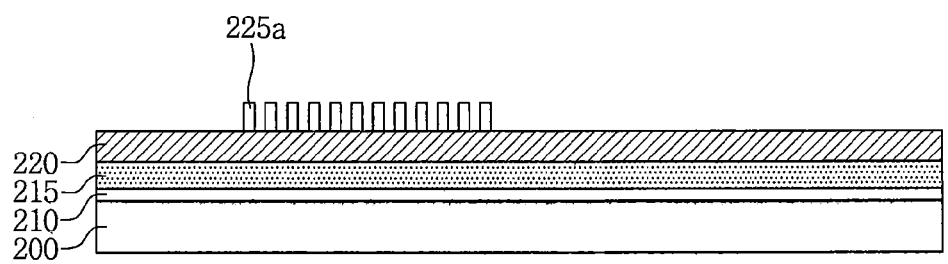

Referring to FIGS. 28A and 28B, methods may include etching the lower hard mask layer 225 using the second spacer patterns 260a as an etching mask to form lower hard mask patterns 225a that expose portions of a surface of the stopper layer 220. The second spacer patterns 260a may be removed.

Figure 29A:
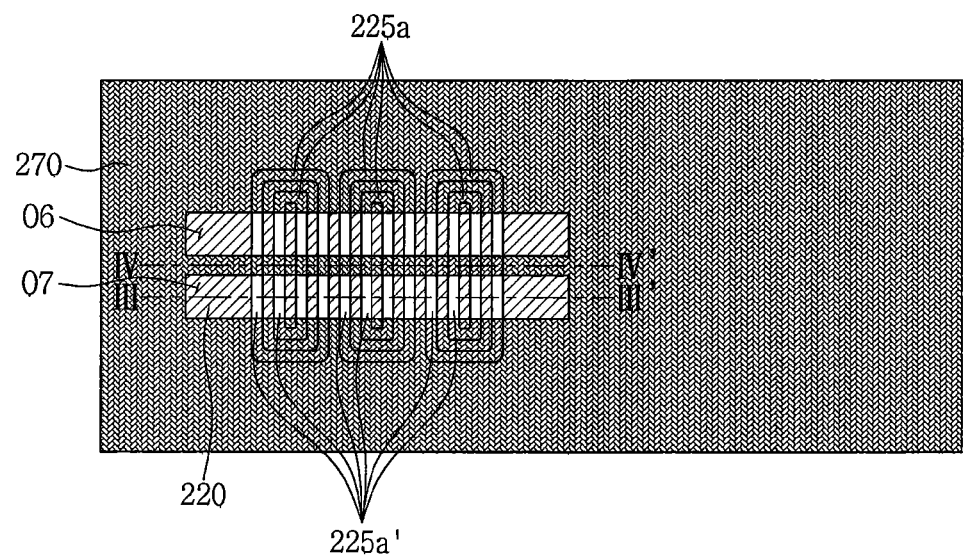
Figure 29B:
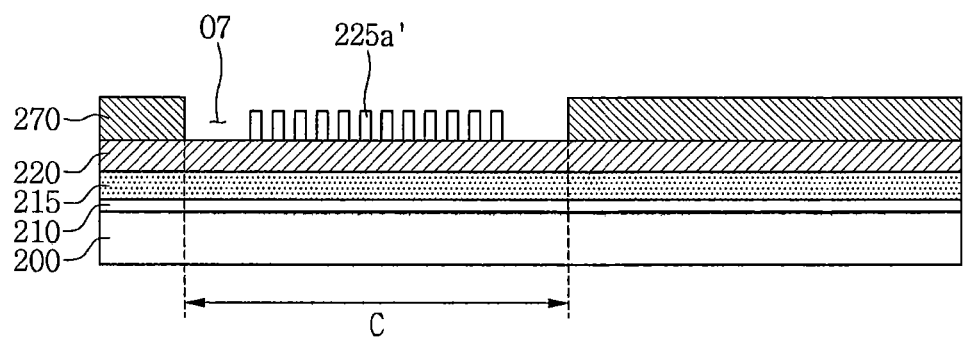
Figure 29C:
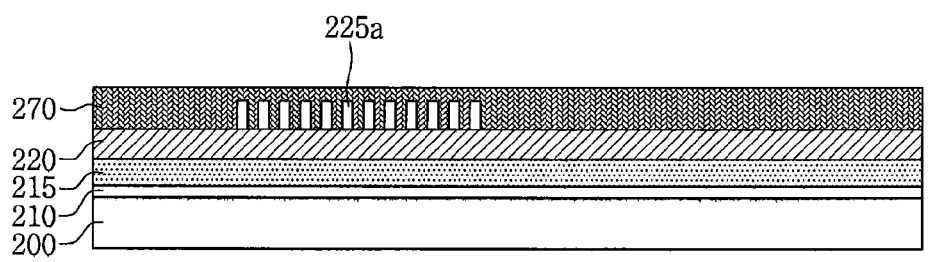

Referring to FIGS. 29A, 9B, and 29C, methods may include forming a second patterning mask pattern 270 on the lower hard mask patterns 225a that expose portions of a surface of the stopper layer 220. The second patterning mask pattern 270 may expose a cell area C and may cover a common source line area. The second patterning mask pattern 270 may include opening patterns O6 and O7 that may expose respective portions of a surface of the stopper layer 220 and may expose respective portions of the lower hard mask patterns 225a'. Therefore, the lower hard mask patterns 225a and 225a' may be classified as the exposed lower hard mask patterns 225a' and the masked lower hard mask patterns 225a. The second patterning mask pattern 270 may include a soft mask of an organic based material, such as a photoresist, or a hard mask of an inorganic based material. The second patterning mask pattern 270 may define a cell area C using the opening patterns O6 and O7. The second patterning mask pattern 270 may commonly form an active area in the cell area C. That is, referring to FIG. 29C, the second patterning mask pattern 270 may cover a surface of the stopper layer 220 and the lower hard mask patterns 225a to commonly form an active area that may be used as a common source line area.

Figure 30A:
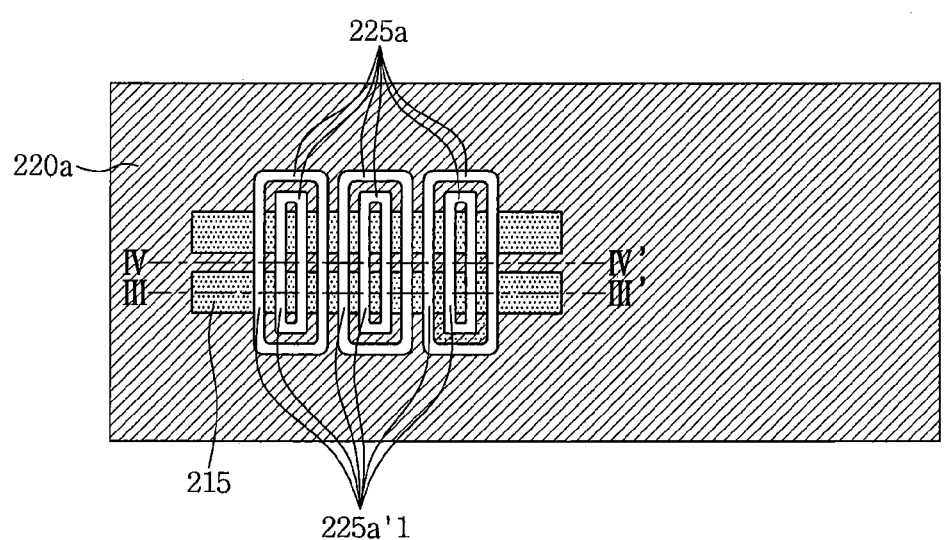
Figure 30B:
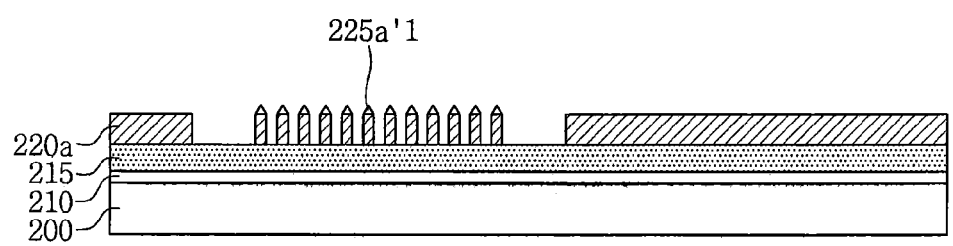
Figure 30C:
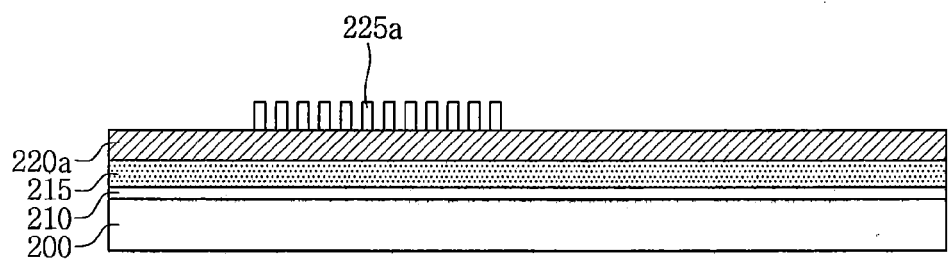

Referring to FIGS. 30A, 30B, and 30C, methods may include etching the stopper layer 220 using the second patterning mask pattern 270 as an etching mask to form stopper patterns 220a that expose portions of a surface of the data storage layer 215. Specifically, the second patterning mask pattern 270 may be removed, and the stopper layer 220 may be patterned using the lower hard mask patterns 225a as an etching mask to form stopper patterns 220a in which portions of the data storage layer 215 may be exposed. The lower hard mask patterns 225a' that are exposed by the opening patterns O6 and O7 may not be completely removed and may remain as thinned lower hard mask patterns 225a'1. The lower hard mask patterns 225a of an area that is masked by the second patterning mask pattern 270 may remain as they are.

Figure 31A:
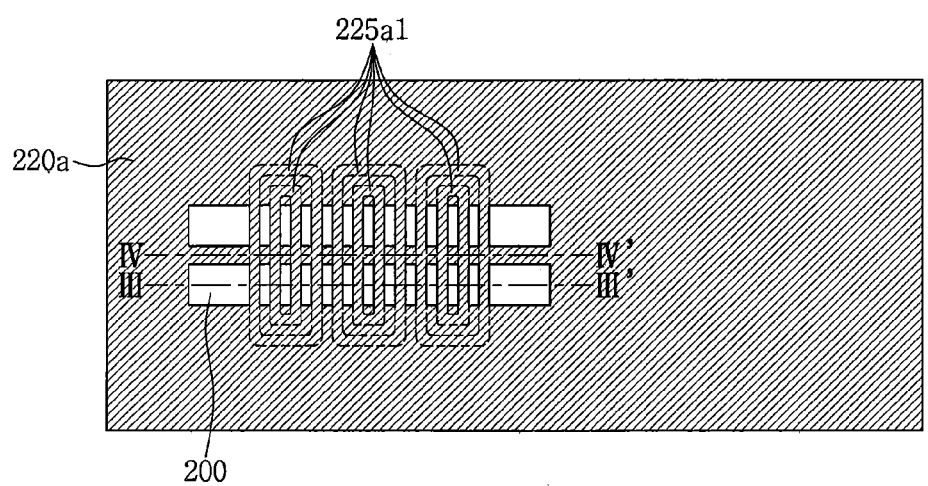
Figure 31B:
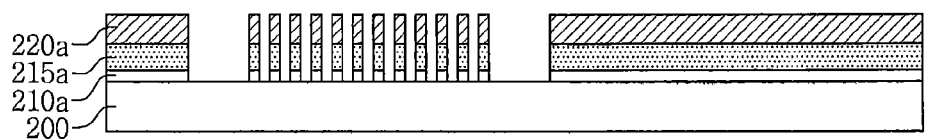
Figure 31C:
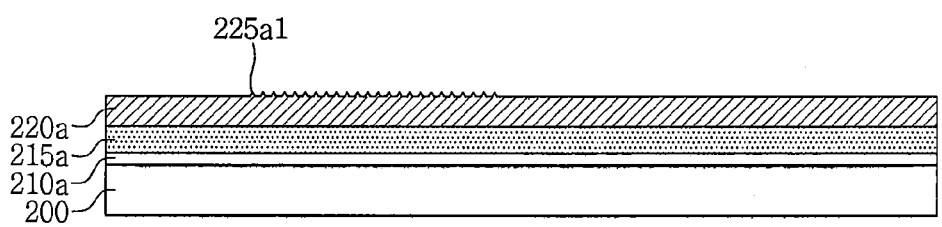

Referring to FIGS. 31A, 31B, and 31C, methods may include etching the data storage layer 215 and the tunnel dielectric layer 210 of the cell area C using the stopper patterns 220a as an etching mask to form data storage layer patterns 215a and tunnel dielectric layer patterns 210a that expose portions of a surface of the substrate 200. The remaining thinned lower hard mask patterns 225a'1 that are exposed by the opening patterns O6 and O7 may be removed completely and the stopper patterns 220a may be exposed entirely.

Figure 32A:
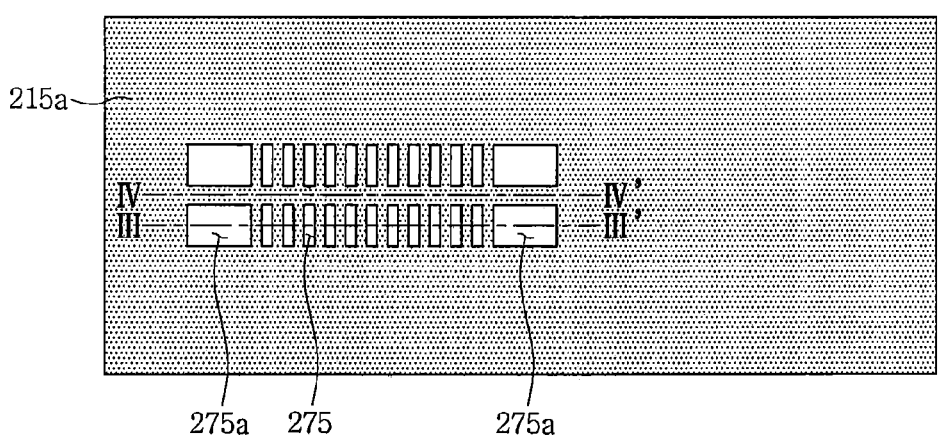
Figure 32B:
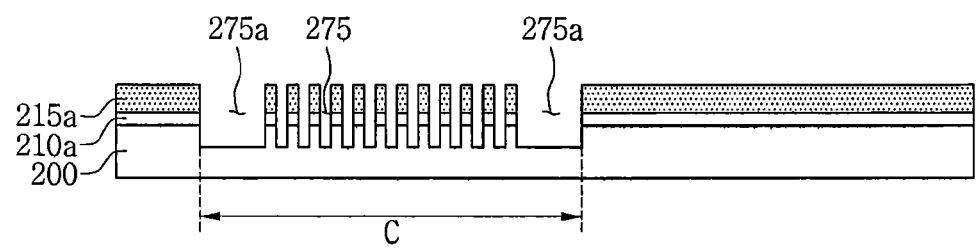
Figure 32C:
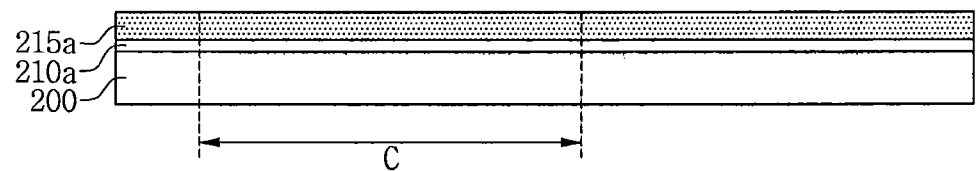

Referring to FIGS. 32A, 32B, and 32C, methods may include etching the substrate 200 using the stopper patterns 220a, the data storage layer patterns 215a, and the tunnel dielectric layer patterns 210a as etching masks to form cell trenches 275. Simultaneously, the remaining thinned lower hard mask patterns 225a1 and the stopper patterns 220a may be removed. In a top view, the trenches 275 may have a rod shape or a bar shape. In other words, in a plan view, the trenches 275 may have an elongated rectangular shape. A dummy area 275a may be formed in an edge of the cell area C. Referring to FIG. 32C, the active area in the cell area C may be formed commonly. The active area that is commonly formed may be used as a common source line. Therefore, a CSL may be formed without regard to the contact size of a cell.

Hereinafter, methods of fabricating semiconductor device according to various embodiments of the inventive concepts may be implemented the same as described in FIGS. 15 to 18. Therefore, the description thereof will not be repeated.

FIGS. 33 to 36 are plan views schematically illustrating intermediate process operations in methods of forming an active area of semiconductor devices according to some embodiments of the inventive concepts. After performing a method of fabricating a semiconductor device according to FIGS. 1A and 1B to 10A and 10B, methods of forming the active area of the semiconductor device will be described. The same reference numerals used in the above drawings are used for the same elements. Cross-sectional views of the semiconductor device may also be illustrated with reference to FIGS. 11B and 11C to 14B and 14C.

Figure 33:
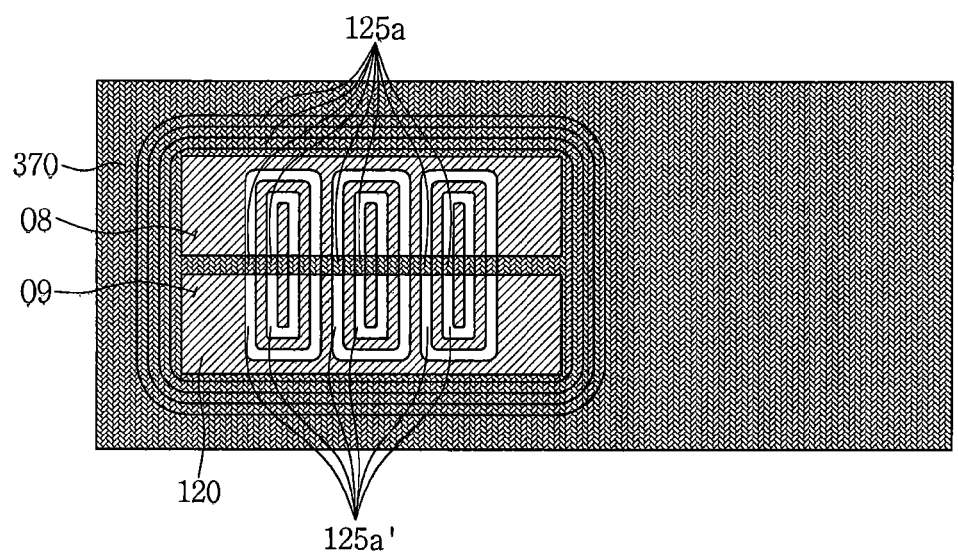
FIGS. 33 to 36 are plan views schematically illustrating intermediate process operations in methods of forming an active area of semiconductor devices according to some embodiments of the inventive concepts.

Referring to FIGS. 33, 11B, and 11C, methods may include forming a second patterning mask pattern 370 on lower hard mask patterns 125a that expose a surface of a stopper layer 120. The second patterning mask pattern 370 may expose a cell area C and cover a common source line. The second patterning mask pattern 370 may include opening patterns O8 and O9 that expose respective portions of a surface of the stopper layer 120 and expose respective portions of the lower hard mask patterns 125a'. Therefore, the lower hard mask patterns 125a and 125a' may be classified as exposed lower hard mask patterns 125a' and masked lower hard mask patterns 125a. The second patterning mask pattern 370 may include a soft mask of an organic based material, such as a photoresist, or a hard mask of an inorganic based material. The second patterning mask pattern 370 may define a cell area C using the opening patterns O8 and O9. Here, the opening patterns O8 and O9 in a top view may be formed in a rectangular shape that exposes most of the lower hard mask patterns 125a. Specifically, the opening patterns O8 and O9 may expose a round perimeter or a connection shape of the lower hard mask patterns 125a'. Then, the lower hard mask pattern 125a' that is exposed may have a semicircular band shape. In other words, in a plan view, the lower hard mask patterns 125a' exposed by the opening patterns O8 and O9 may have a "U" shape. The second patterning mask pattern 370 may commonly form an active area in the cell area C. That is, referring to FIG. 11C, the second patterning mask pattern 370 may cover a surface of the stopper layer 120 and the lower hard mask patterns 125a to commonly form an active area that may be used as a common source line area.

Figure 34:
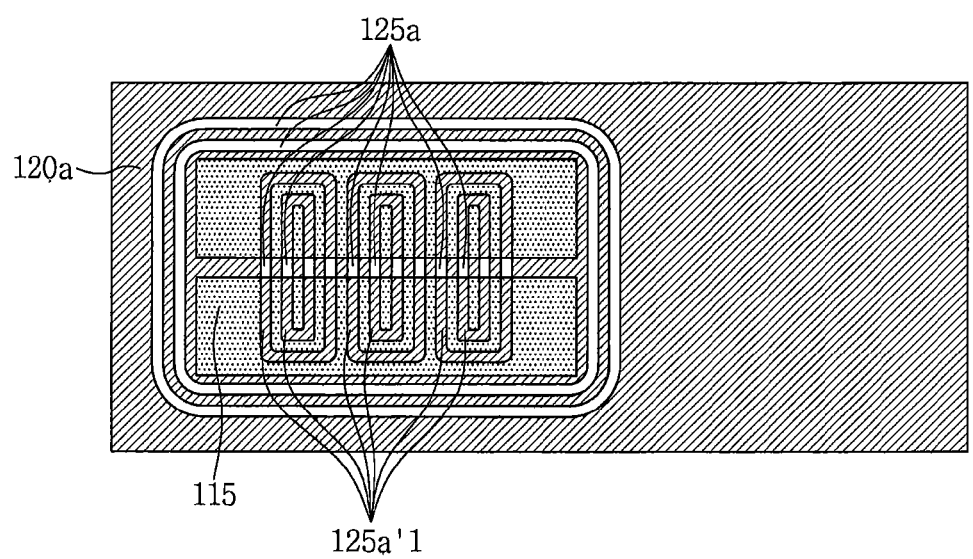

Referring to FIGS. 34, 12B, and 12C, methods may include etching the stopper layer 120 using the second patterning mask pattern 370 as an etching mask to form stopper patterns 120a that expose portions of a surface of the data storage layer 115. Specifically, the second patterning mask pattern 370 is removed, and the stopper layer 120 is patterned using the lower hard mask patterns 125a as an etching mask to form stopper patterns 120a in which the data storage layer 115 is selectively exposed. The lower hard mask patterns 125a' that are exposed by the opening patterns O8 and O9 may not be completely removed and may remain as thinned lower hard mask patterns 125a'1. The lower hard mask patterns 125a of an area that is masked by the second patterning mask pattern 170 may remain as they are.

Figure 35:
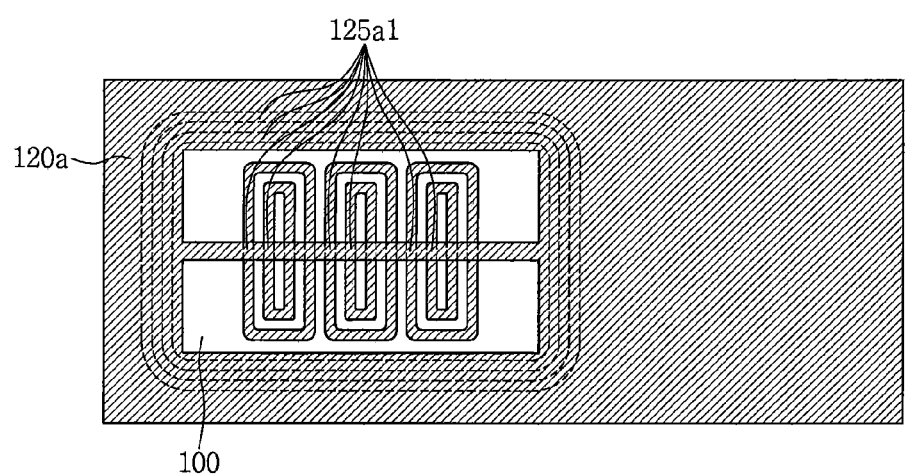

Referring to FIGS. 35, 13B, and 13C, methods may include etching the data storage layer 115 and the tunnel dielectric layer 110 of the cell area C using the stopper patterns 120a as an etching mask to form data storage layer patterns 115a and tunnel dielectric layer patterns 110a that expose portions of a surface of the substrate 100. The remaining thinned lower hard mask patterns 125a'1 that are exposed by the opening patterns O8 and O9 may be removed to expose the stopper patterns 120a entirely. The lower hard mask patterns 125a of an area that is masked by the second patterning mask pattern 170 may not be completely removed and may remain as thinned lower hard mask patterns 125a1.

Figure 36:
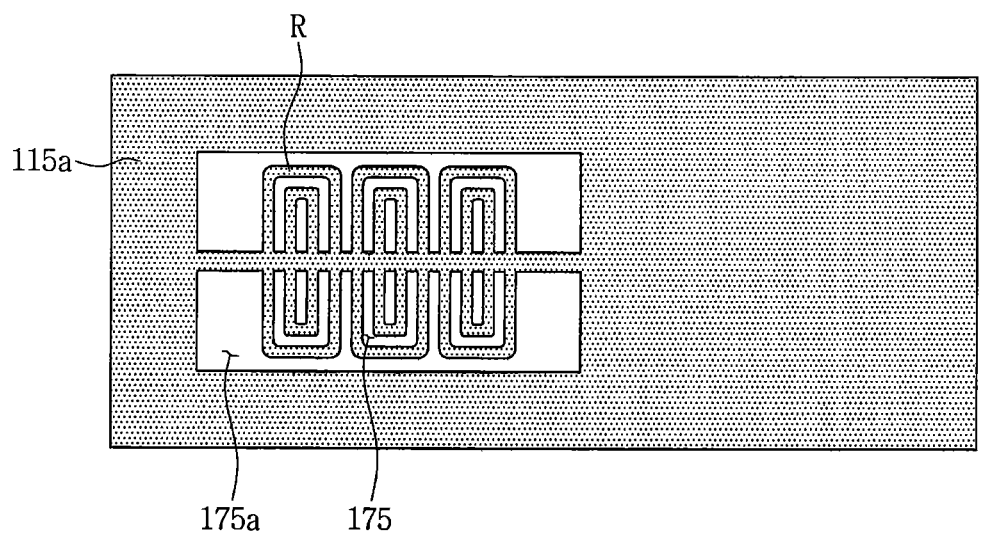

Referring to FIGS. 36, 14B, and 14C, methods may include etching the substrate 100 using the stopper patterns 120a, the data storage layer patterns 115a, and the tunnel dielectric layer patterns 110a as etching masks to form cell trenches 175. Simultaneously, the remaining thinned lower hard mask patterns 125a1 and the stopper patterns 120a may be removed. A dummy area 175a may be formed in the edge of the cell area C. In a top view, the cell trenches 175 may have a semicircular band shape or a bar shape. In other words, in a plan view, some of the trenches 175 may have an elongated rectangular shape and some of the trenches 175 may have a "U" shape. The dummy area 175a may have a shape that surrounds the cell trenches 175. The active area in the cell area C may be formed commonly. The active area that is commonly formed may be used as a common source line. An active area R of the cell area C may have a semicircular band shape.

Hereinafter, methods of fabricating semiconductor device according to various exemplary embodiments of the inventive concepts may be implemented the same as described in FIGS. 15 to 18. Therefore, the description thereof will not be repeated.

FIGS. 37 to 40 are plan views of the semiconductor device schematically illustrating intermediate process operations in methods of forming an active area of semiconductor devices according to some embodiments of the inventive concepts. After performing a method of fabricating a semiconductor device according to FIGS. 19A and 19B to 28A and 28B, methods of forming an active area of the semiconductor device will be described. The same reference numerals used for the above drawings are used for the same elements. Cross-sectional views of the semiconductor device may also be illustrated with reference to FIGS. 29B and 29C to 32B and 32C.

Figure 37:
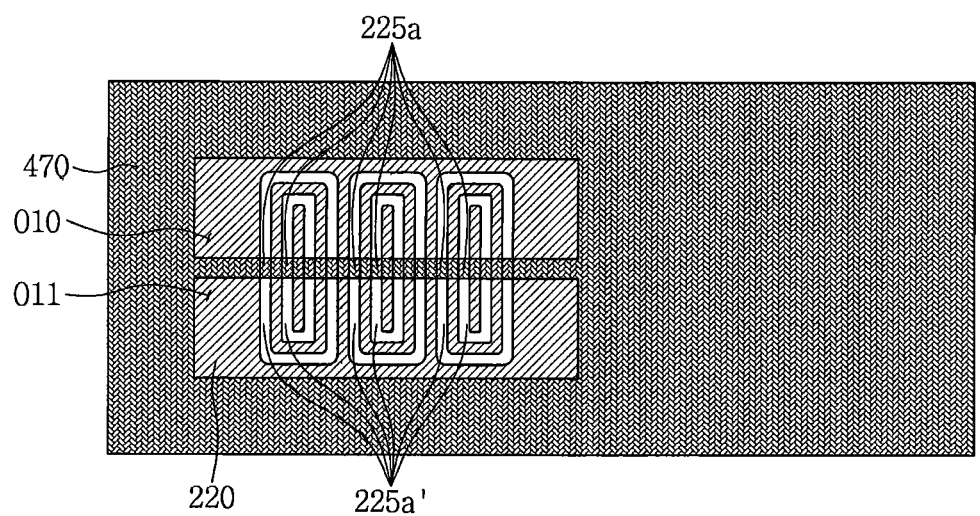
FIGS. 37 to 40 are plan views schematically illustrating intermediate process operations in methods of forming an active area of semiconductor devices according to some embodiments of the inventive concepts.

Referring to FIGS. 37, 29B, and 29C, methods may include forming a second patterning mask pattern 470 on lower hard mask patterns 225a that may expose portions of a surface of a stopper layer 220. The second patterning mask pattern 470 may expose a cell area C and cover a common source line area. The second patterning mask pattern 470 may include opening patterns O10 and O11 that expose respective portions of a surface of the stopper layer 220 and expose respective portions of the lower hard mask patterns 225a'. Therefore, the lower hard mask patterns 225a and 225a' may be classified as exposed lower hard mask patterns 225a' and masked lower hard mask patterns 225a. The second patterning mask pattern 470 may include a soft mask of an organic based material, such as a photoresist, or a hard mask of an inorganic based material. The second patterning mask pattern 470 may define a cell area C by the opening patterns O10 and O11. Specifically, in a top view, the opening patterns O10 and O11 may expose a round perimeter or a connection shape of the lower hard mask patterns 225a'. Then, the lower hard mask pattern 225a' that is exposed may have a semicircular band shape. Then, the lower hard mask pattern 225a' that is exposed may have a semicircular band shape. In other words, in a plan view, the lower hard mask patterns 225a' exposed by the opening patterns O10 and O11 may have a "U" shape. The second patterning mask pattern 470 may commonly form an active area in the cell area C. That is, referring to FIG. 29C, the second patterning mask pattern 470 may cover a surface of the stopper layer 220 and the lower hard mask patterns 225a to commonly form an active area that may be used as a common source line area.

Figure 38:
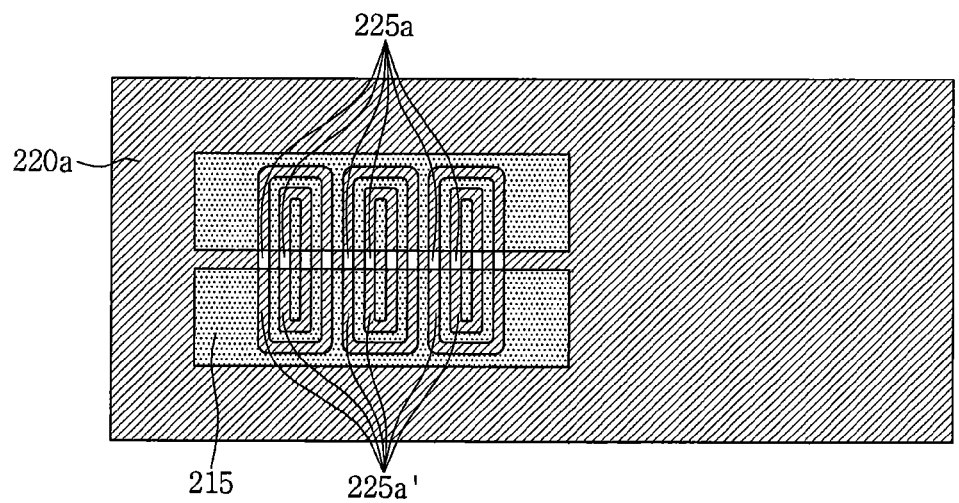

Referring to FIGS. 38, 30B, and 30C, methods may include etching the stopper layer 220 using the second patterning mask pattern 470 as an etching mask to form stopper patterns 220a that expose portions of a surface of the data storage layer 215. Specifically, the second patterning mask pattern 470 is removed, the stopper layer 220 is patterned using lower hard mask pattern 225a' as an etching mask to form stopper patterns 220a that expose portions of the data storage layer 215. The lower hard mask patterns 225a' that are exposed by the opening patterns O10 and O11 may not be removed completely and may remain as thinned lower hard mask patterns 225a'1. The lower hard mask patterns 225a of an area that is masked by the second patterning mask pattern 470 may remain as they are.

Figure 39:
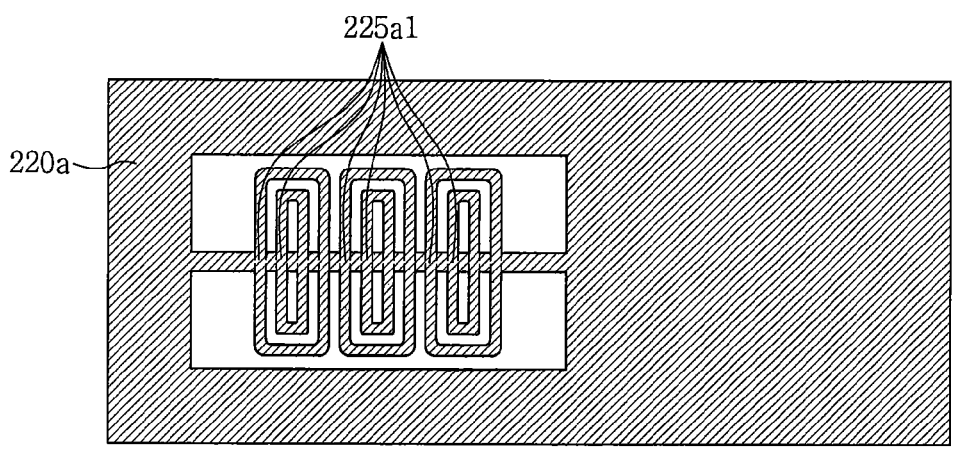

Referring to FIGS. 39, 31B, and 31C, methods may include etching the data storage layer 215 and the tunnel dielectric layer 210 of the cell area C using the stopper patterns 220a as an etching mask to form data storage layer patterns 215a and tunnel dielectric layer patterns 210a that expose portions of a surface of the substrate 200. The remaining thinned lower hard mask patterns 225a'1 that are exposed by the opening patterns O10 and O11 may be completely removed to expose the stopper patterns 220a entirely. The lower hard mask patterns 225a of an area that is masked by the second patterning mask pattern 270 may not be completely removed and may remain as thinned lower hard mask patterns 225a1.

Figure 40:
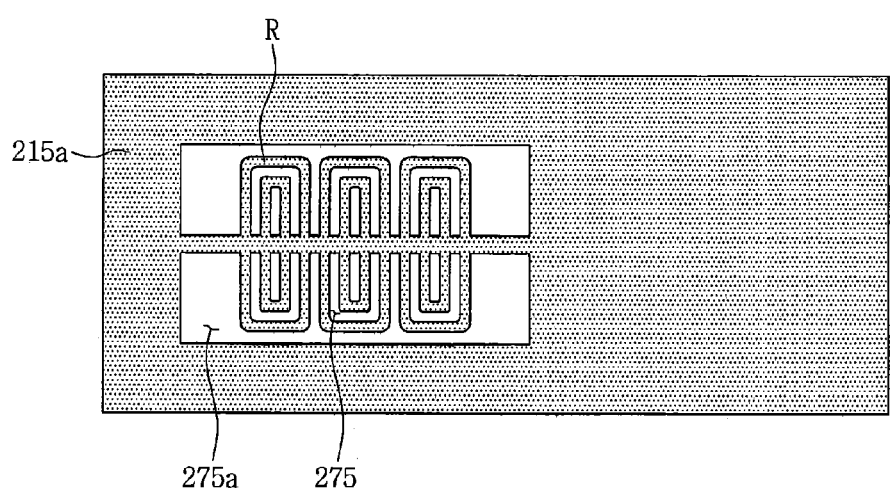

Referring to FIGS. 40, 32B and 32C, methods may include etching the substrate 200 using the stopper patterns 220a, the data storage layer patterns 215a, and the tunnel dielectric layer patterns 210a as etching masks to form cell trenches 275. Simultaneously, the remaining thinned lower hard mask patterns 225a1 and the stopper patterns 220a may be removed. A dummy area 275a may be formed on the edge of the cell area C. In a top view, the cell trenches 275 may have a semicircular band shape or a bar shape. In other words, in a plan view, some of the trenches 275 may have an elongated rectangular shape and some of the trenches 275 may have a "U" shape. The dummy area 275a may have a shape that surrounds the cell trenches 275. Then, the active area in the cell area C may be formed commonly. The active area that is commonly formed may be used as a common source line. The active area R of the cell area C may have a semicircular band shape.

Hereinafter, methods of fabricating semiconductor device according to various exemplary embodiments of the inventive concepts may be implemented the same as described in FIGS. 15 to 18. Therefore, the description thereof will not be repeated.

Figure 41:
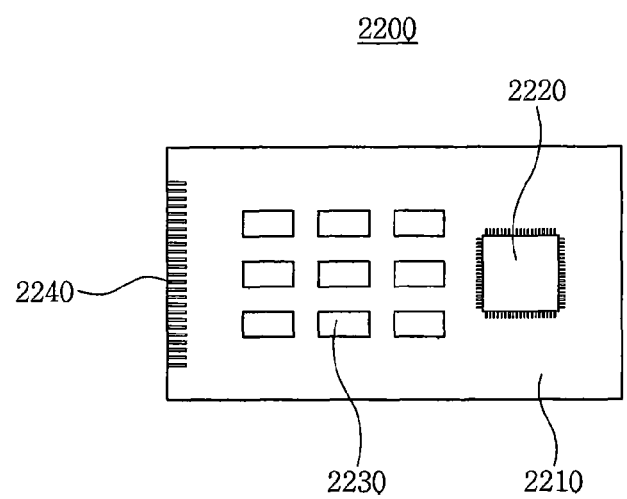
FIG. 41 is a plan view schematically illustrating a semiconductor module according to some embodiments of the inventive concepts.

FIG. 41 is a plan view schematically illustrating a semiconductor module according to some embodiments of the inventive concepts. Referring to FIG. 41, the semiconductor module 2200 according to the embodiment of the inventive concepts may include a processor 2220 and semiconductor devices 2230 mounted on a module substrate 2210. The processor 2220 or the semiconductor devices 2230 may include at least one of the semiconductor devices fabricated according to various embodiments of the inventive concepts. Conductive in/out terminals 2240 may be disposed on at least one side of the module substrate 2210.

Figure 42:
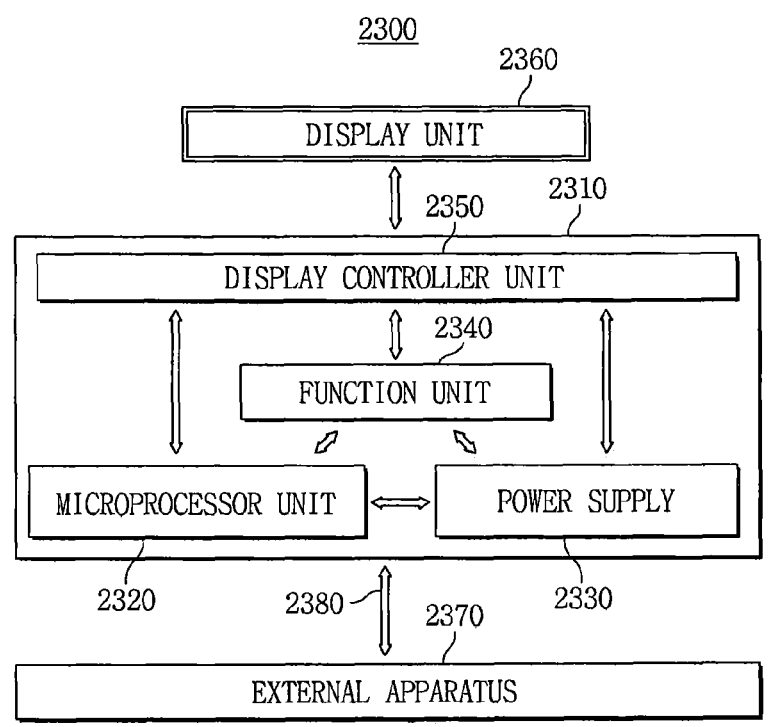
FIGS. 42 and 43 are block diagrams schematically illustrating electronic systems according to some embodiments of the inventive concepts
Figure 43:
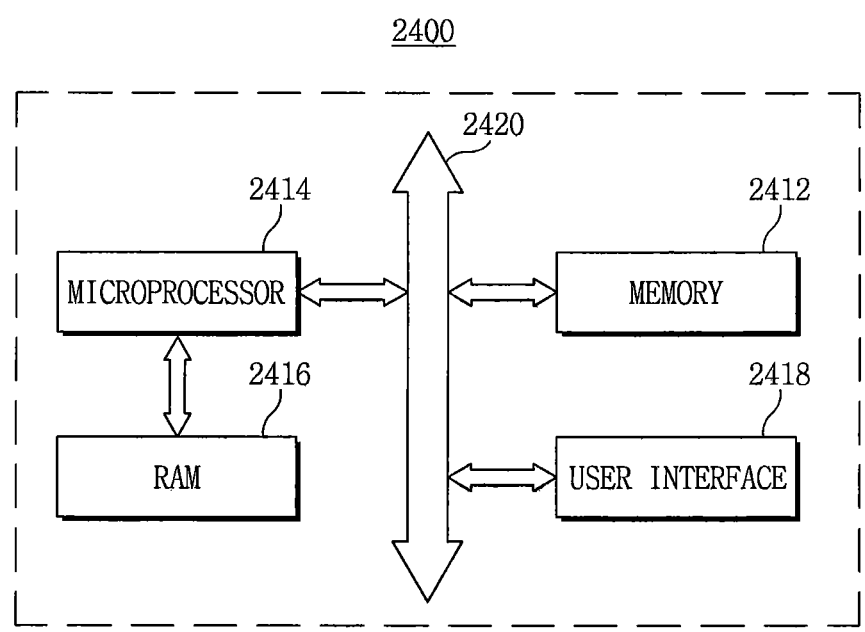

FIGS. 42 and 43 are block diagrams schematically illustrating electronic systems according to embodiments of the inventive concepts.

Referring to FIG. 42, an electronic system 2300 according to some embodiments of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or a motherboard, and/or a case that have printed circuit board (PCB), etc. The microprocessor unit 2320, the power supply 2330, the function unit 2340, and the display controller unit 2350 may be disposed or mounted on an upper surface or an inside of the body 2310. A display unit 2360 may be disposed on the upper surface of the body 2310 or an inside/outside of the body 2310. The display unit 2360 may display an image that is processed by the display controller unit 2350. For example, the display unit 2360 may include a liquid crystal display (LCD), an active matrix organic light emitting diode (AMOLED), or various display panels. The display unit 2360 may include a touch screen. Therefore, the display unit 2360 may have input and output function. The power supply 2330 may apply current or a voltage to the microprocessor unit 2320, the function unit 2340, the display controller unit 2350, etc. The power supply 2330 may include a rechargeable battery, a socket for a dry cell, or a voltage/current converter. The microprocessor unit 2320 may receive a voltage from the power supply 2330 and control the function unit 2340 and the display unit 2360. For example, the microprocessor unit 2320 may include a central processing unit (CPU) or an application processor (AP). The function unit 2340 may include a touch pad, a touch screen, a volatile/nonvolatile memory, a memory card controller, a camera, a lighting, a voice and video driving processor, a wireless transmission and reception antenna, a speaker, a microphone, a Universal Serial Bus (USB) port, and other units that have various functions. The microprocessor unit 2320 or the function unit 2340 may include at least one of semiconductor devices fabricated according to various embodiments of the inventive concepts.

Referring to FIG. 43, an electronic system 2400 according to some embodiments of the inventive concepts may include a microprocessor 2414, a memory system 2412, and a user interface 2418 that perform data communication through a bus 2420. The microprocessor 2414 may include a CPU or an AP. The electronic system 2400 may also include the RAM 2416 that directly communicates with the microprocessor 2414. The microprocessor 2414 and/or the RAM 2416 may be assembled in a single package. The user interface 2418 may be used for inputting data to the electronic system 2400 and outputting data from the electronic system 2400. For example, the user interface 2418 may include a touch pad, a touch screen, a key board, a mouse, a scanner, a voice detector, a cathode ray tube (CRT) monitor, an LCD, an AMOLED, a plasma display panel (PDP), a printer, a lighting, and other various input and output devices. The memory system 2412 may store operational codes of the microprocessor 2414, data processed by the microprocessor 2414, and input data from the outside. The memory system 2412 may include a memory controller, a hard disk, and a solid state drive (SSD). The microprocessor 2414, the RAM 2416, and/or the memory system 2412 may include at least one of semiconductor devices fabricated according to various embodiments of the inventive concepts.

In some embodiments of the present inventive concepts, a three-dimensional (3D) memory array may be provided. The 3D memory array may be monolithically formed in one or more physical levels of arrays of memory cells having an active area disposed above a silicon substrate and circuitry associated with the operation of those memory cells, whether such associated circuitry is above or within such the substrate. The term "monolithic" means that layers of each level of the array are directly deposited on the layers of each underlying level of the array.

In some embodiments of the present inventive concepts, the 3D memory array may include vertical NAND strings that are vertically oriented such that at least one memory cell is located over another memory cell. The at least one memory cell may comprise a data storage layer.

The following patent documents, that are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

According to various embodiments of the inventive concepts, the semiconductor devices may be fabricated with fine patterns that overcome the limitation of optical resolution of exposures using a quadruple patterning technology.

In the semiconductor devices according to various embodiments of the inventive concepts, active areas in cell areas are commonly formed using a multi-pattern, and then the CSL may be formed without regard to the contact size of a cell. Therefore, the yield of fabricating the semiconductor device may increase.

The other various effects have been described in the above detailed descriptions.

Methods of fabricating the structures of the semiconductor device according to embodiments of the inventive concepts have been illustrated and described above. Although a few embodiments have been described with reference to the accompanying drawings, it will be understood by those skilled in the art that various modifications can be made without departing from the scope of the present invention and without changing essential features. Therefore, the above-described examples should be considered in a descriptive sense only and not for purposes of limitation.

What is claimed is:

1. A method of fabricating a semiconductor device, the method comprising:

forming a stopper layer, a lower hard mask layer, an intermediate hard mask layer, and an upper hard mask pattern on a substrate;

forming first spacer patterns on sidewalls of the upper hard mask pattern;

removing the upper hard mask pattern;

selectively etching the intermediate hard mask layer using the first spacer patterns as an etching mask to form intermediate hard mask patterns;

removing the first spacer patterns;

forming second spacer patterns on sidewalls of the intermediate hard mask patterns;

removing the intermediate hard mask patterns;

selectively etching the lower hard mask layer using the second spacer patterns as an etching mask to form lower hard mask patterns;

removing the second spacer patterns;

forming a patterning mask pattern that exposes a cell area and covers a common source line area on the lower hard mask patterns and the stopper layer;

selectively etching the stopper layer using the lower hard mask patterns and the patterning mask pattern as etching masks to form stopper patterns; and removing the patterning mask pattern.

2. The method of claim 1, wherein the upper hard mask pattern comprises a first upper hard mask pattern and a second upper hard mask pattern disposed on the first upper hard mask pattern.

3. The method of claim 2, wherein the first upper hard mask pattern comprises a spin on hard mask (SOH) and the second upper hard mask pattern comprises silicon oxynitride.

4. The method of claim 1, wherein the intermediate hard mask layer comprises a first intermediate hard mask layer and a second intermediate hard mask layer disposed on the first intermediate hard mask layer.

5. The method of claim 4, wherein the first intermediate hard mask layer comprises a spin on hard mask (SOH) and the second intermediate hard mask layer comprises silicon oxynitride.

6. The method of claim 1, further comprising:

forming a tunnel dielectric layer and a data storage layer between the substrate and the stopper layer;

etching the tunnel dielectric layer and the data storage layer using the stopper patterns as an etching mask to form tunnel dielectric layer patterns and data storage layer patterns; and etching the substrate using the stopper patterns as an etching mask to form cell trenches.

7. The method of claim 6, further comprising:

forming a core insulating layer on the substrate on which the cell trenches are formed;

recessing the core insulating layer to form a cell filling insulator in the cell trenches;

forming a dielectric layer on the cell filling insulator; and forming a control gate electrode layer and a capping insulating layer on the dielectric layer.

8. The method of claim 1, wherein the patterning mask pattern comprises a photoresist.

9. The method of claim 1, wherein the patterning mask pattern comprises opening patterns that expose portions of the lower hard mask patterns and the stopper layer.

10. The method of claim 9, wherein forming the stopper patterns comprises etching the stopper layer using the lower hard mask patterns that are exposed by the opening patterns as an etching mask to form the stopper patterns, and wherein the lower hard mask patterns that are exposed by the opening patterns are not completely removed by etching the stopping layer.

11. The method of claim 9, wherein the opening patterns expose a "U" shape of the lower hard mask patterns in a plan view.

12. The method of claim 6, wherein ones of the cell trenches comprise an elongated rectangular shape in a plan view.

13. The method of claim 6, wherein ones of the cell trenches comprise a "U" shape in a plan view.

14. The method of claim 13, wherein forming the cell trenches comprises forming dummy areas in a shape that surrounds the cell trenches.

15. A method of fabricating a semiconductor device, the method comprising:
   forming a stopper layer, a lower hard mask layer, an intermediate hard mask layer, and an upper hard mask layer on a substrate;
   forming a first patterning mask pattern that has an elongated rectangular shape on the upper hard mask layer;
   etching the upper hard mask layer using the first patterning mask pattern as an etching mask to form an upper hard mask pattern;
   forming first spacer patterns on sidewalls of the upper hard mask pattern;
   removing the upper hard mask pattern;
   selectively etching the intermediate hard mask layer using the first spacer patterns as an etching mask to form intermediate hard mask patterns;
   removing the first spacer patterns;
   forming second spacer patterns on sidewalls of the intermediate hard mask patterns;
   removing the intermediate hard mask patterns;
   selectively etching the lower hard mask layer using the second spacer patterns as an etching mask to form lower hard mask patterns;
   removing the second spacer patterns;
   forming a second patterning mask pattern that exposes a cell area and covers a common source line area on the lower hard mask patterns and the stopper layer; and
   selectively etching the stopper layer using the lower hard mask patterns and the second patterning mask pattern as etching masks to form stopper patterns.

16. A method of fabricating a semiconductor device, the method comprising:
   forming an etch stop layer, a lower hard mask layer that has an etch selectivity with respect to the etch stop layer, a first intermediate hard mask layer that has an etch selectivity with respect to the lower hard mask layer, a second intermediate hard mask layer that has an etch selectivity with respect to the first intermediate hard mask layer, a first upper hard mask layer that has an etch selectivity with respect to the second intermediate hard mask layer, and a second upper hard mask layer that has an etch selectivity with respect to the first upper hard mask layer on a substrate;
   forming a first patterning mask pattern on the second upper hard mask layer;
   etching, in a first etch process, the first and second upper hard mask layers using the first patterning mask pattern as an etching mask to expose portions of the second intermediate hard mask layer;
   removing the first patterning mask pattern;
   forming a first spacer layer on portions of the first and second upper hard mask layers that remain after the first etch process and on the portions of the second intermediate hard mask layer that are exposed;
   partially etching the first spacer layer and removing the second upper hard mask layer in a second etch process to expose the first upper hard mask layer and to form first spacer patterns on sidewalls of the first upper hard mask layer;
   removing the first upper hard mask layer from between the first spacer patterns;
   etching, in a third etch process, the first and second intermediate hard mask layers using the first spacer patterns as an etching mask to expose portions of the lower hard mask layer;
   removing the first spacer patterns;
   forming a second spacer layer on portions of the first and second intermediate hard mask layers that remain after the third etch process and on the portions of the lower hard mask layer that are exposed;
   partially etching the second spacer layer and removing the second intermediate hard mask layer in a fourth etch process to expose the first intermediate hard mask layer and to form second spacer patterns on sidewalls of the first intermediate hard mask layer;
   removing the first intermediate hard mask layer from between the second spacer patterns;
   etching, in a fifth etch process, the lower hard mask layer using the second spacer patterns as an etching mask to expose portions of the etch stop layer; and
   removing the second spacer patterns.

17. The method of claim 16, further comprising:
   forming a tunnel dielectric layer and a data storage layer between the substrate and the etch stop layer;
   forming a second patterning mask pattern comprising a plurality of openings spaced apart from each other and extending parallel to each other that expose portions of the lower hard mask layer that remain after the fifth etch process and portions of the etch stop layer;
   etching, in a sixth etch process, the etch stop layer using the second patterning mask pattern and the portions of the lower hard mask layer that are exposed as etching masks; and
   etching, in a seventh etch process, the data storage layer and the tunnel dielectric layer using portions of the etch stop layer remaining after the sixth etch process as an etching mask.

18. The method of claim 16, wherein the first patterning mask pattern comprises a plurality of parallel elongated rectangular shaped openings that expose portions of the second upper hard mask layer.

19. The method of claim 16, wherein the first patterning mask pattern comprises a plurality of parallel elongated rectangular shapes that cover portions of the second upper hard mask layer.

20. The method of claim 16, wherein spaces in a lateral direction between ones of the second spacer patterns are approximately equal to thicknesses in the lateral direction of the ones of the second spacer patterns.

* * * * *